United States Patent
Sato

(10) Patent No.: US 7,915,125 B2
(45) Date of Patent: Mar. 29, 2011

(54) SEMICONDUCTOR DEVICE AND METHOD OF MANUFACTURING THE SAME

(75) Inventor: Hidekazu Sato, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/401,007

(22) Filed: Mar. 10, 2009

(65) Prior Publication Data

US 2009/0230469 A1 Sep. 17, 2009

(30) Foreign Application Priority Data

Mar. 12, 2008 (JP) .................. 2008-063262

(51) Int. Cl.
*H01L 21/336* (2006.01)
(52) U.S. Cl. ........ 438/279; 438/286; 257/337; 257/335; 257/E29.027; 257/E21.618; 257/E21.633
(58) Field of Classification Search .................. 438/197, 438/199, 213, 217, 279, 286; 257/335, 228, 257/E29.027, E21.618, E21.619, E21.633, 257/E21.634, 337

See application file for complete search history.

(56) References Cited

U.S. PATENT DOCUMENTS

| 5,719,081 A | * | 2/1998 | Racanelli et al. | ............. 438/290 |
| 5,731,611 A | * | 3/1998 | Hshieh et al. | ................. 257/341 |
| 6,218,889 B1 | * | 4/2001 | Fujiki et al. | .................... 327/427 |
| 2002/0020873 A1 | * | 2/2002 | Klodzinski | .................... 257/328 |

FOREIGN PATENT DOCUMENTS

| JP | 11-163320 A | 6/1999 |
| JP | 2006-13344 A | 12/2006 |

* cited by examiner

*Primary Examiner* — Caridad M Everhart
(74) *Attorney, Agent, or Firm* — Westerman, Hattori, Daniels & Adrian, LLP

(57) ABSTRACT

A method of manufacturing a semiconductor device is provided which comprises: forming a first gate insulating film and a second gate insulating film in an active region of a semiconductor substrate; introducing an impurity of a first conductivity type into a first site where a first body region is to be formed, the first site being disposed under the first gate insulating film in the active region; forming a gate electrode on each of the first gate insulating film and the second gate insulating film; and introducing an impurity of the first conductivity type into the first site and a second site where a second body region is to be formed, the second site being disposed under the second gate insulating film in the active region, to form the first body region and the second body region, respectively.

8 Claims, 20 Drawing Sheets

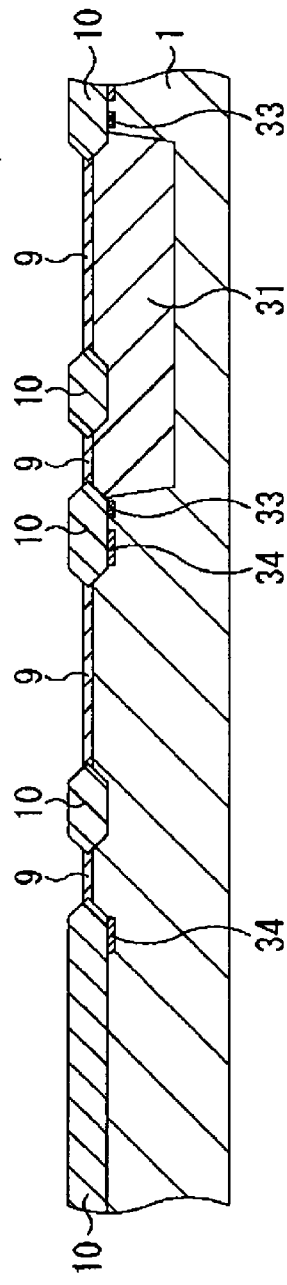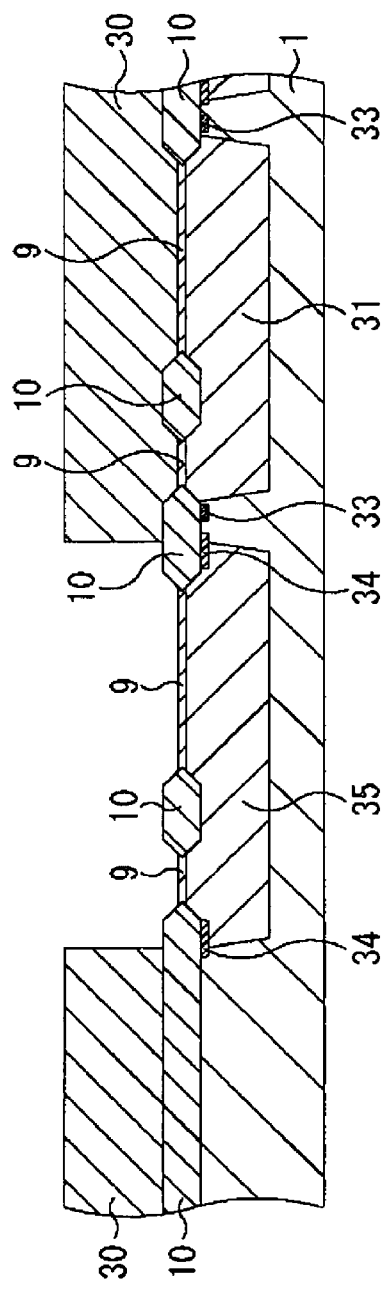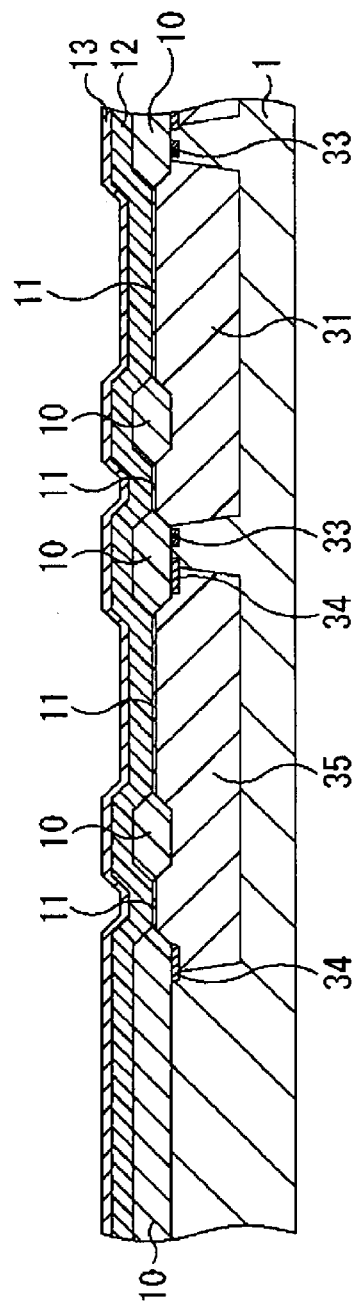

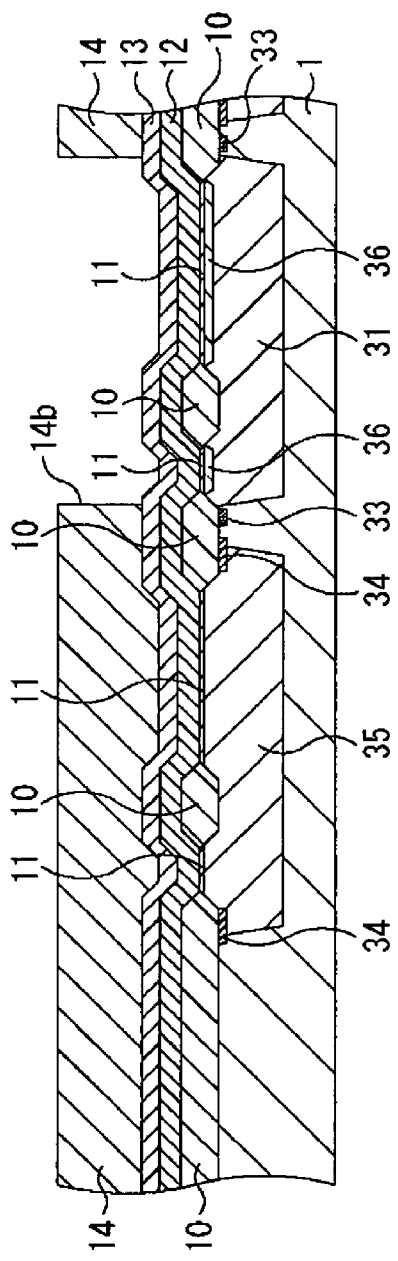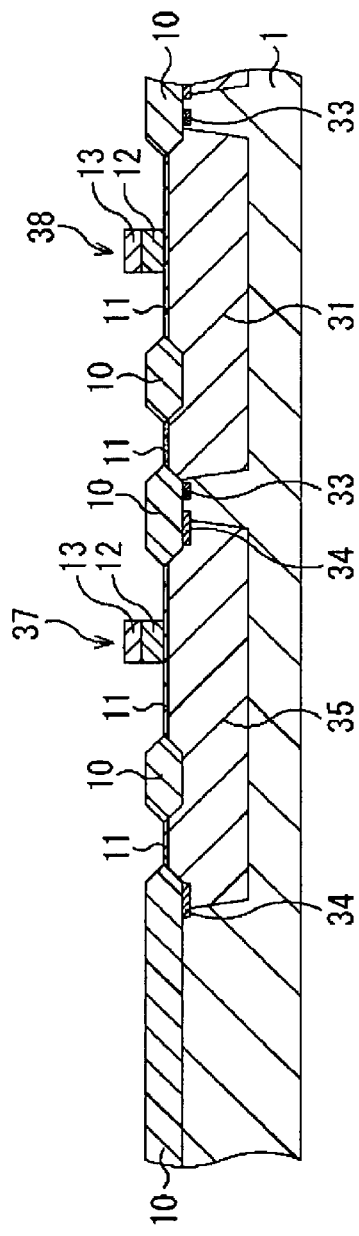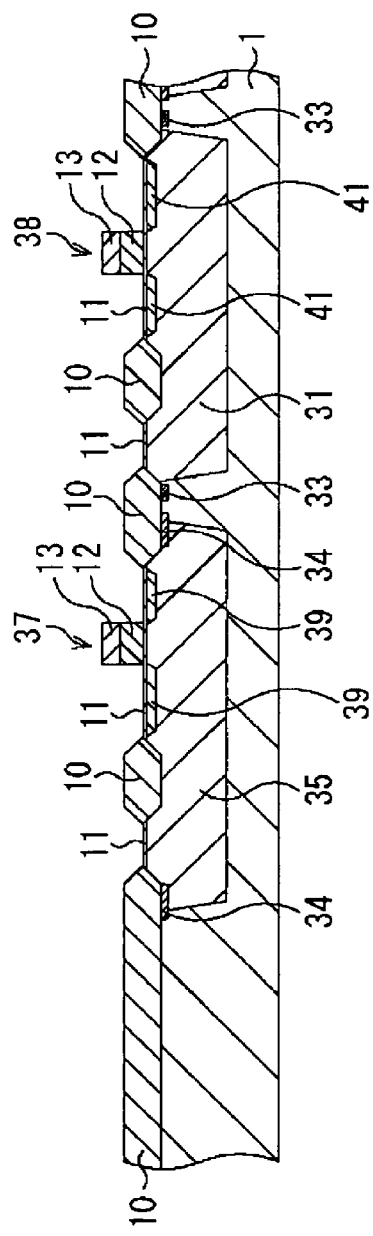

SEMICONDUCTOR DEVICE AND METHOD OF MANUFACTURING THE SAME

CROSS-REFERENCE TO RELATED APPLICATIONS

This application claims the benefit of priority from Japanese Patent Application No. 2008-63262 filed on Mar. 12, 2008, the entire contents of which are incorporated herein by reference.

BACKGROUND OF THE INVENTION

1. Field of the Invention

The embodiments discussed herein are directed to a semiconductor device that is suitable for use in a lateral double-diffused metal-oxide-semiconductor field-effect transistor (LDMOSFET) such as power MOSFET.

2. Description of Related Art

The voltage of a power supply used for a CPU of a computer or the like tends to become lower. Accordingly, a power supply circuit with a synchronous rectification system has been widely used. Power supply circuits use either a diode rectification system or a synchronous rectification system. In the diode rectification system, the conversion efficiency (loss) of a power supply circuit is determined based on the forward voltage and the output current of a diode. When a large current is output, a loss at an output rectification portion increases and thus a heat sink for the heat generated by the loss is necessary. In the synchronous rectification system, for example, a power MOSFET having a high switching speed is used for main switching, and a switch function is synchronized.

An exemplary power MOSFET includes an LDMOSFET having an insulating film, which is larger than that of a gate insulating film and is provided between a gate electrode and a drain layer, the parasitic capacitance of which is decreased. In the LDMOSFET, a breakdown voltage between a source and a drain is ensured, and an on-resistance is decreased. Therefore, LDMOSFETs are suitable for switching at a high speed or a high frequency.

When the switching speed of an LDMOSFET is important, a gate insulating film having a small thickness is provided. When the gate breakdown-voltage is important, a gate insulating film having a large thickness is provided. When an integrated circuit including a plurality of LDMOSFETs, which includes gate insulating films having different thicknesses, are manufactured in the fewest possible processes, forming a body region without depending on the thicknesses of the gate insulating films is necessary.

For example, Japanese Laid-open Patent Publication Nos. 2006-13344 and H11-163320 disclose related arts.

SUMMARY

Aspects of a semiconductor integrated circuit may include a method of manufacturing a semiconductor device. The method comprises: forming a first gate insulating film and a second gate insulating film in an active region of a semiconductor substrate; introducing an impurity of a first conductivity type into a first site where a first body region is to be formed, the first site being disposed under the first gate insulating film in the active region; forming a gate electrode on each of the first gate insulating film and the second gate insulating film; and introducing an impurity of the first conductivity type into the first site and a second site where a second body region is to be formed, the second site being disposed under the second gate insulating film in the active region, to form the first body region and the second body region, respectively.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIGS. 3-34 illustrate a manufacturing method according to a first embodiment;

DESCRIPTION OF PREFERRED EMBODIMENTS

Figure 1:
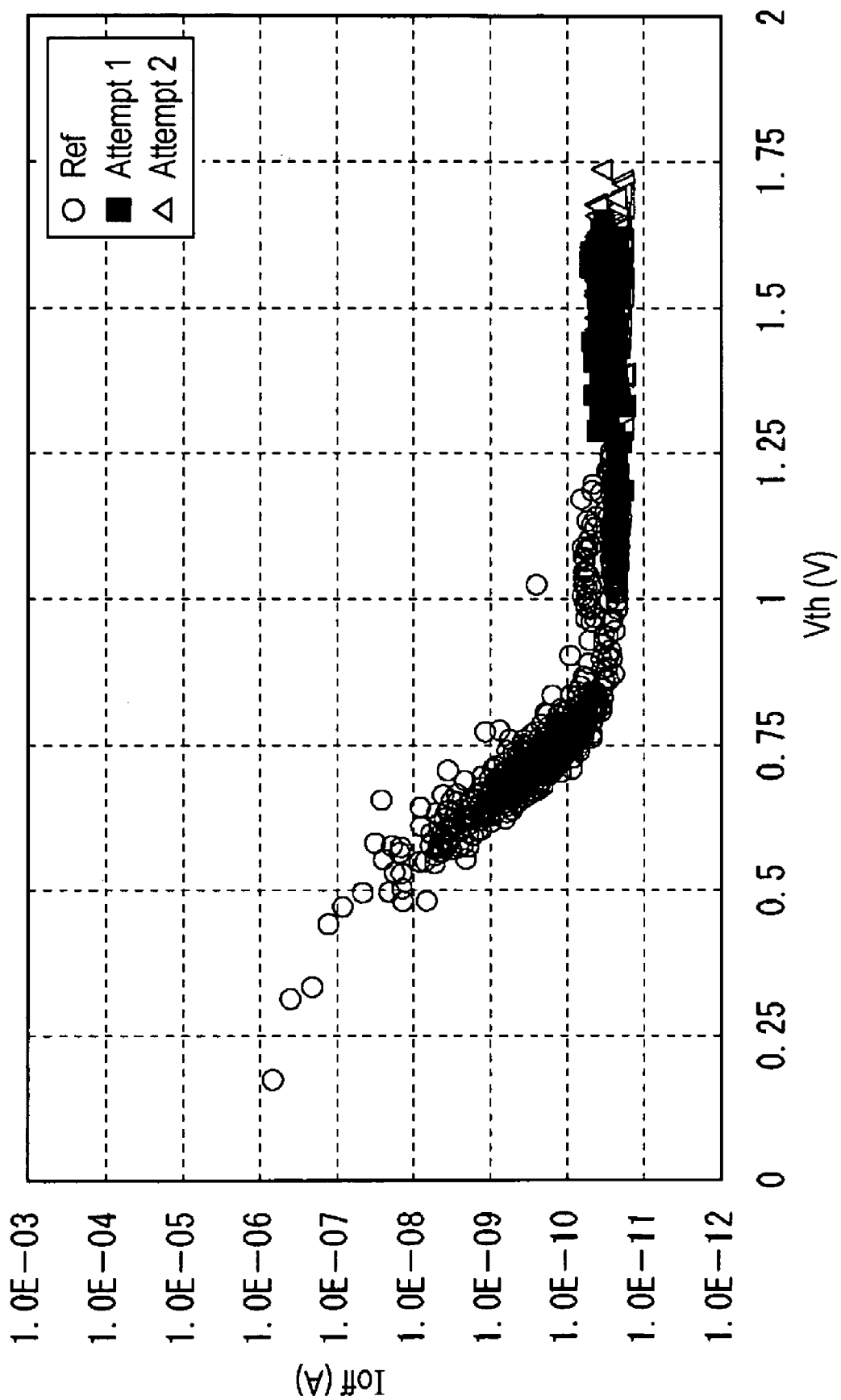
FIG. 1 illustrates the correlation between an off-current and a threshold voltage of an LDMOSFET.

When LDMOSFETs including gate insulating films having different thicknesses are integrated, optimum conditions for forming a body region of an LDMOSFET, which has a higher switching speed and includes a gate insulating film having a smaller thickness, are selected. In this case, the impurity concentration of a body region of an LDMOSFET, which includes a gate insulating film having a large thickness, becomes insufficient. The insufficient impurity concentration of the body region causes a decrease in the threshold voltage, an increase in off-leak current, or a decrease in the breakdown voltage between a source region and a drain region due to punch-through. Consequently, the transistor characteristics vary.

When optimum conditions for forming a body region are selected for each of LDMOSFETs including gate insulating films having different thicknesses, the number of processes increases.

When intermediate conditions for forming a body region, which lie between conditions for an LDMOSFET including a gate insulating film having a large thickness and conditions for an LDMOSFET including a gate insulating film having a small thickness are selected, for example, characteristics that increase in the switching speed may be sacrificed.

In an LDMOSFET, a power semiconductor device, when the impurity concentration of a body layer is insufficient, and thus the transistor characteristics easily vary, an impurity is introduced into a site where the body layer is to be formed. This impurity introduction is referred to as "first impurity introduction". For example, the first impurity introduction is performed during impurity introduction for forming a channel region of a transistor of a second conductivity type on a substrate that has the power semiconductor device thereon. After the first impurity introduction is performed, an impurity of the same conductivity type is introduced into the site where the body layer is to be formed, thereby forming the body layer. This impurity introduction is referred to as "second impurity introduction". Since the formed body layer has a relatively high impurity concentration, variation in the transistor characteristics may be suppressed.

A plurality of power semiconductor devices including gate insulating films having different thicknesses are formed in some cases. Optimum conditions for forming a body region of a power semiconductor device including a gate insulating film having a small thickness are selected. In this case, the impurity concentration of a power semiconductor device including a gate insulating film having a large thickness may be compensated to an optimum value by, for example, applying an embodiment described below. Accordingly, a power semiconductor device having a high switching speed and high characteristics may be provided while suppressing an increase in the number of processes.

The first impurity introduction is performed in a state in which an electrode material to be formed into a gate electrode of the power semiconductor device is deposited, under conditions where an impurity passes through the electrode material and a gate insulating film.

When the first impurity introduction is performed before forming a gate insulating film, for example, an out-diffusion in which an impurity diffuses to outside of a semiconductor substrate and a phenomenon in which the impurity is taken (absorbed) into the gate insulating film, which are caused by a thermal oxidation treatment performed while forming the gate insulating film, may be prevented. Accordingly, fluctuation in the amount of impurity introduced by the first impurity introduction is prevented, and thus the transistor characteristics do not vary. The small amount of impurity introduced by the first impurity introduction may be sufficient. That is, the impurity concentration may be small. When the first impurity introduction is performed after forming a gate insulating film, a resist mask is formed on the gate insulating film. However, organic contamination on the gate insulating film, which is caused by forming the resist mask, may be prevented, thus improving the insulating property and reliability of the gate insulating film. Since the first impurity introduction is performed together with impurity introduction for forming a channel region of a transistor of a second conductivity type, a special process need not be added.

FIG. 1 illustrates the correlation between the off-current ($I_{off}$) and the threshold voltage ($V_{th}$) of an LDMOSFET including a gate insulating film having a large thickness. Attempt 1 in the figure shows a case where the first impurity introduction is performed in a region where a body region is to be formed. In Attempt 1, since an impurity is introduced into the region where the body region is to be formed, the impurity is introduced in a part of a channel region. Attempt 2 in the figure shows a case where the first impurity introduction is performed in the entire channel region. Ref in the figure shows a case where the first impurity introduction is not performed. In Ref, optimum conditions for forming a body layer of an LDMOSFET including a gate insulating film having a small thickness are selected. Therefore, when the threshold voltage varies in a range of low values, the variation in the off-current also increases. In contrast, in Attempt 1 and Attempt 2, the first impurity introduction is performed in the LDMOSFET including the gate insulating film having the large thickness. Consequently, the threshold voltage of the LDMOSFET including the gate insulating film having the large thickness may be set to be a high value without affecting the characteristics of the LDMOSFET including the gate insulating film having the small thickness. According to Attempt 1 and Attempt 2, the impurity concentration of body layers of LDMOSFETs including gate insulating films having different thicknesses may be independently controlled. Therefore, the transistor characteristics of the LDMOSFETs may be independently adjusted.

Figure 2:
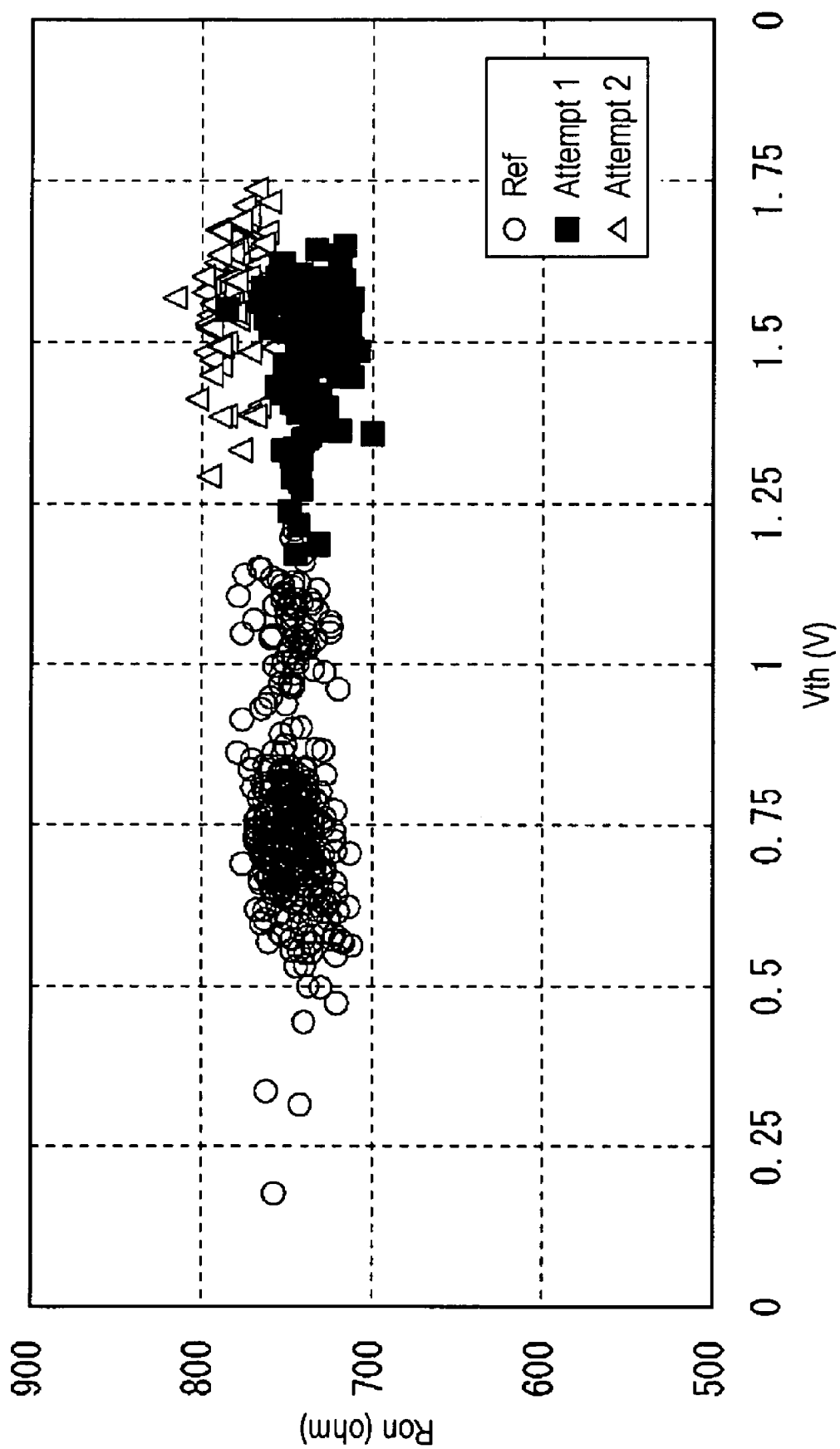
FIG. 2 illustrates the correlation between an on-resistance and a threshold voltage of an LDMOSFET.

FIG. 2 illustrates the correlation between the on-resistance ($R_{on}$) and the threshold voltage ($V_{th}$) of an LDMOSFET including a gate insulating film having a large thickness. The lower the on-resistance, the higher the switching speed of the power MOSFET. Attempt 1 in the figure shows a case where the first impurity introduction is performed. In Attempt 1, since an impurity is introduced into a region where a body region is to be formed, a portion of the impurity is introduced in a channel region, for example a region under a gate electrode of a semiconductor substrate. Attempt 2 in the figure shows a case where the first impurity introduction is performed in the entire channel region. Ref in the figure shows a case where the first impurity introduction is not performed. In Ref, optimum conditions for forming a body layer of an LDMOSFET including a gate insulating film having a small thickness are selected. Therefore, the threshold voltage of the LDMOSFET including the gate insulating film having the large thickness is not set to a high value.

When the variation in the off-current due to a control of the threshold voltage is improved, in both the cases of Attempt 1 and Attempt 2, the transistor characteristics may be stabilized by performing the fewest possible processes.

By the first impurity introduction, the transistor characteristics may be improved without increasing the number of processes used to form the LDMOSFET including a gate insulating film having a large thickness and without affecting the characteristics of an LDMOSFET including a gate insulating film having a small thickness. In addition, the impurity concentrations of body layers of LDMOSFETs including gate insulating films having different thicknesses may be independently controlled. Therefore, the characteristics of the LDMOSFETs may be independently adjusted. When optimum conditions for forming a body of an LDMOSFET including a gate insulating film having a large thickness are selected and characteristics of an LDMOSFET including a gate insulating film having a small thickness are adjusted, an embodiment described below may be applied.

FIGS. 3 to 34 illustrate a first embodiment. A semiconductor device according to the first embodiment includes LDMOSFETs and CMOSFETs. The semiconductor device in the first embodiment includes, for example, an LDMOSFET including a gate insulating film having a large thickness (thick-film LDMOSFET) and an LDMOSFET including a gate insulating film having a small thickness (thin-film LDMOSFET). The semiconductor device in the first embodiment includes, for example, a 5-V p-channel MOSFET and n-channel MOSFET. FIGS. 3 to 18 illustrate element regions of n-channel LDMOSFETs. FIGS. 19 to 34 illustrate element regions of CMOSFETs formed on a substrate that has the LDMOSFETs thereon.

Figure 3:
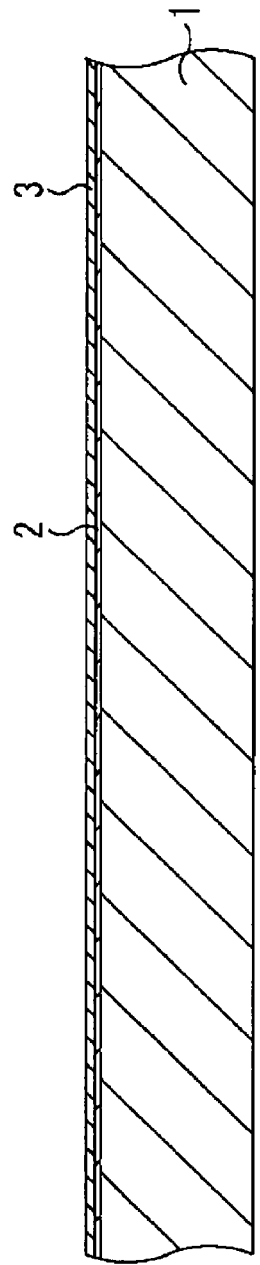
Figure 19:
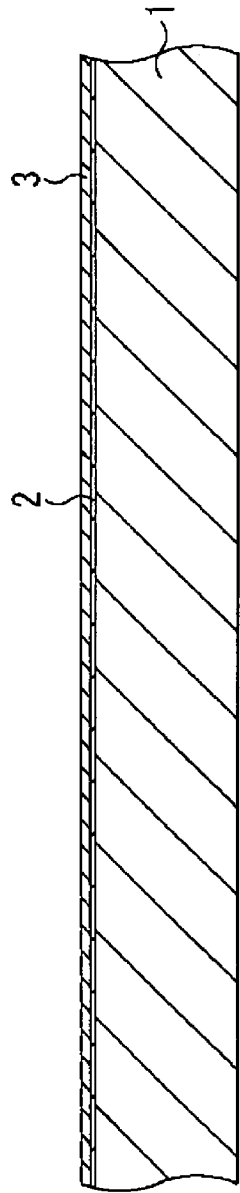

As illustrated in FIGS. 3 and 19, an oxide film 2 is formed on a semiconductor substrate 1, and a nitride film 3 is formed on the oxide film 2. Specifically, a surface of a semiconductor substrate such as a silicon wafer, for example, the p-type semiconductor substrate 1 is thermally oxidized to form the oxide film 2 having a thickness of about 5 nm. A silicon nitride film is then deposited on the oxide film 2 by a chemical vapor deposition (CVD) method or the like to form the nitride film 3 having a thickness of about 100 nm.

Figure 4:
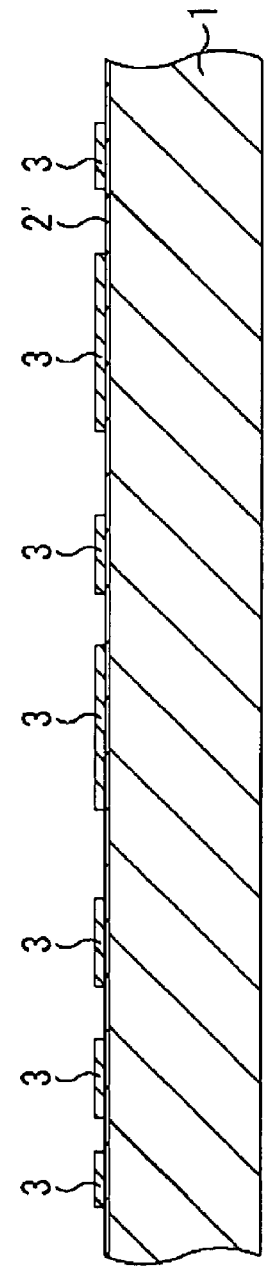
Figure 20:
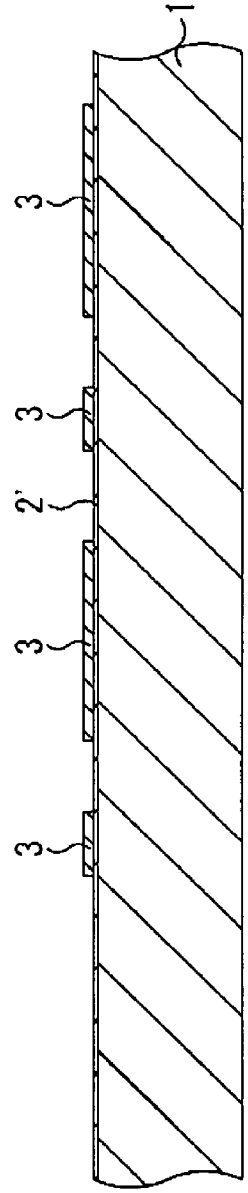

As illustrated in FIGS. 4 and 20, the nitride film 3 and the oxide film 2 are processed. The nitride film 3 and the oxide film 2 are processed by lithography and dry etching so that only element isolation regions are opened. The surface of the semiconductor substrate 1 exposed through the opening portions is thermally oxidized to form an oxide film 2' having a thickness of, for example, about 15 nm.

Figure 5:
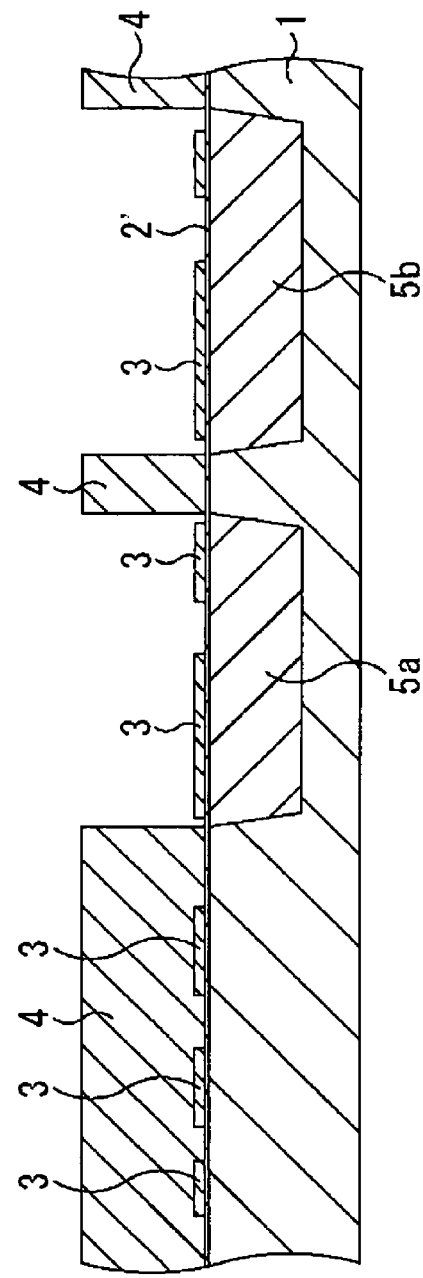
Figure 21:
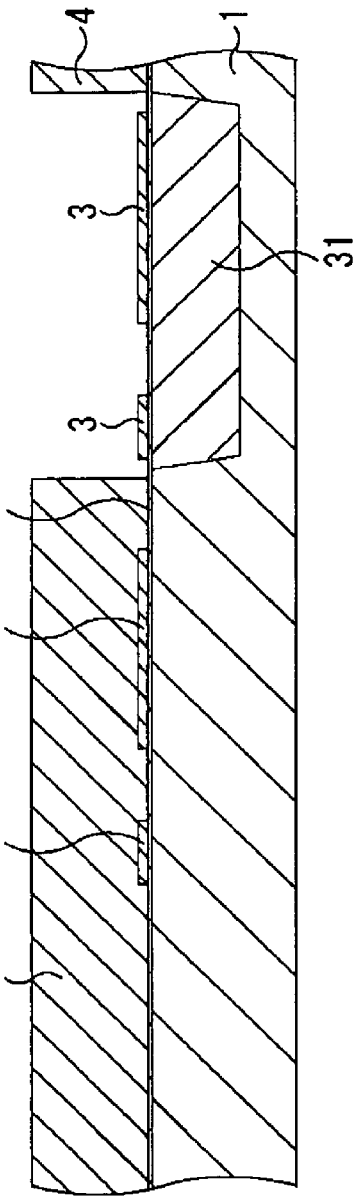

As illustrated in FIGS. 5 and 21, a resist mask 4 is formed. Wells 5a, 5b, and 31 are formed using the resist mask 4. A resist is applied to the entire surface of the semiconductor substrate 1. The applied resist is processed by lithography to form the resist mask 4 for opening regions where the wells are to be formed. An n-type impurity, for example, phosphorus (P+) is ion-implanted using the resist mask 4 under conditions of an acceleration energy of 200 keV and a dose of $4.0 \times 10^{12}/cm^2$. The wells 5a and 5b are formed in the element regions of the LDMOSFETs. The well 31 is formed in the element region of the CMOSFET. The well 5a is a region where a thick-film LDMOSFET including a gate insulating film having a large thickness is formed. The well 5b is a region where a thin-film LDMOSFET including a gate insulating film having a thickness smaller than the thickness of the thick-film LDMOSFET is formed. The well 31 is a region where a p-channel MOSFET is formed. The resist mask 4 is then removed by ashing or the like.

Figure 6:
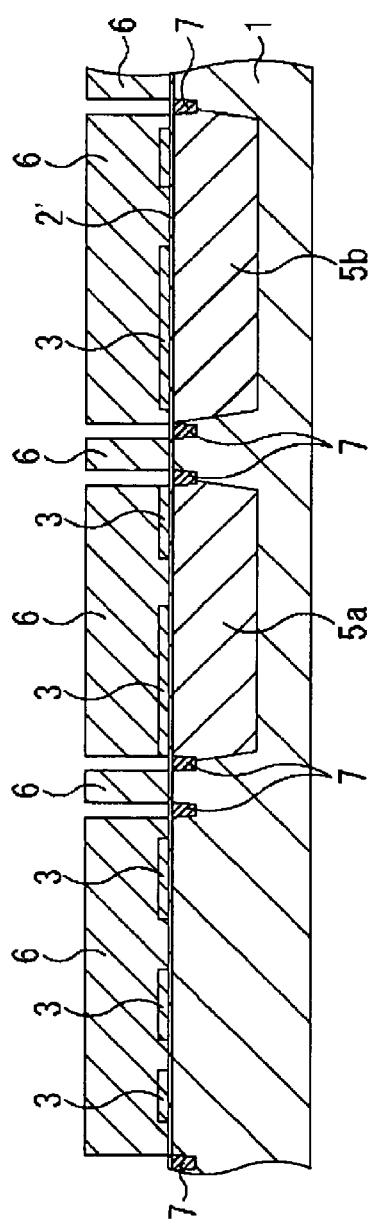
Figure 22:
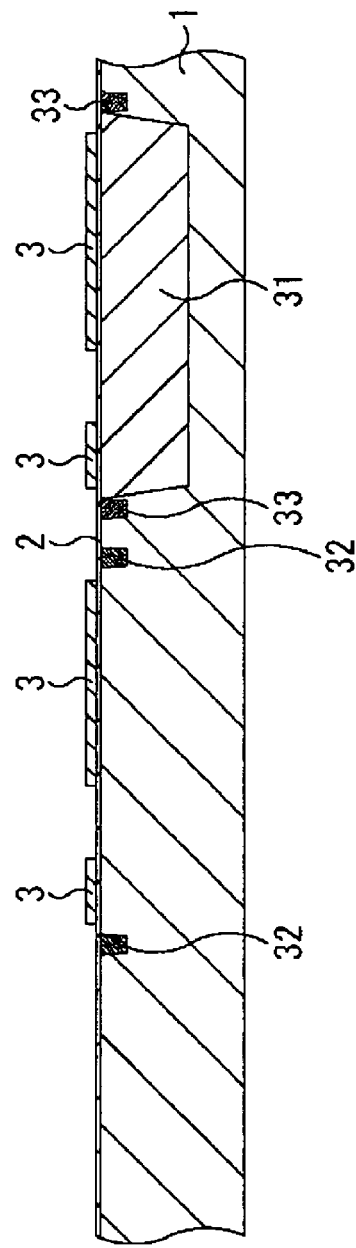

As illustrated in FIGS. 6 and 22, a channel stop region 7 is formed in the element regions of the LDMOSFETs, and channel stop regions 32 and 33 are formed in the element regions of the CMOSFETs. As illustrated in FIG. 6, a resist mask 6 for opening sites where the channel stop region is to be formed in the element regions of the LDMOSFETs is formed on the semiconductor substrate 1 by application of a resist and lithography. Next, an n-type impurity, for example, phosphorus (P+) is ion-implanted using the resist mask 6 under conditions of an acceleration energy of 180 keV and a dose of $2.0 \times 10^{13}/cm^2$. Accordingly, the channel stop region 33 is formed in the element regions of the LDMOSFETs. The resist mask is then removed by ashing or the like.

As illustrated in FIG. 22, a resist mask (not illustrated) for opening sites where a channel stop region is to be formed in the element region of one of the CMOSFETs is formed on the semiconductor substrate 1 by application of a resist and lithography. Next, an n-type impurity, for example, phosphorus (P+) is ion-implanted using the resist mask under conditions of an acceleration energy of 45 keV and a dose of $1.5 \times 10^{13}/cm^2$. Accordingly, the channel stop region 33 is formed in the element region of the CMOSFET. The resist mask is then removed by ashing or the like.

A resist mask (not illustrated) for opening sites where a channel stop region is to be formed in the element region of the CMOSFETs is formed on the semiconductor substrate 1 by application of a resist and lithography. Next, a p-type impurity, for example, boron (B+) is ion-implanted using the resist mask under conditions of an acceleration energy of 30 keV and a dose of $9.0 \times 10^{13}/cm^2$. Accordingly, the channel stop region 32 is formed in the element region of the CMOSFET. The resist mask is then removed by ashing or the like.

Figure 7:
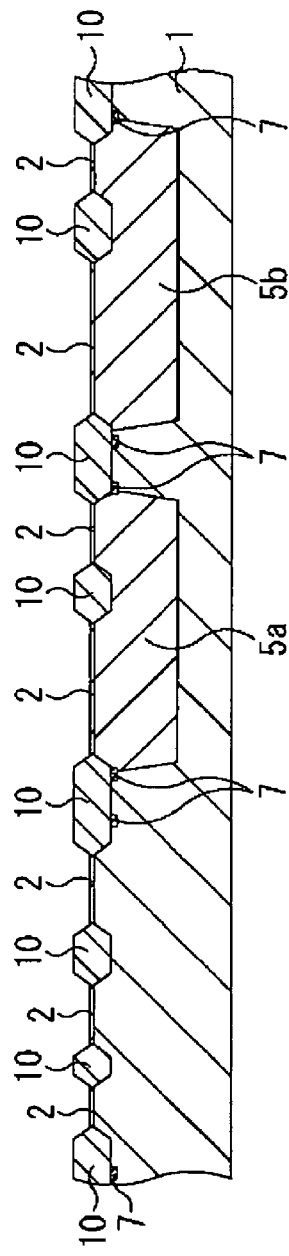
Figure 23:
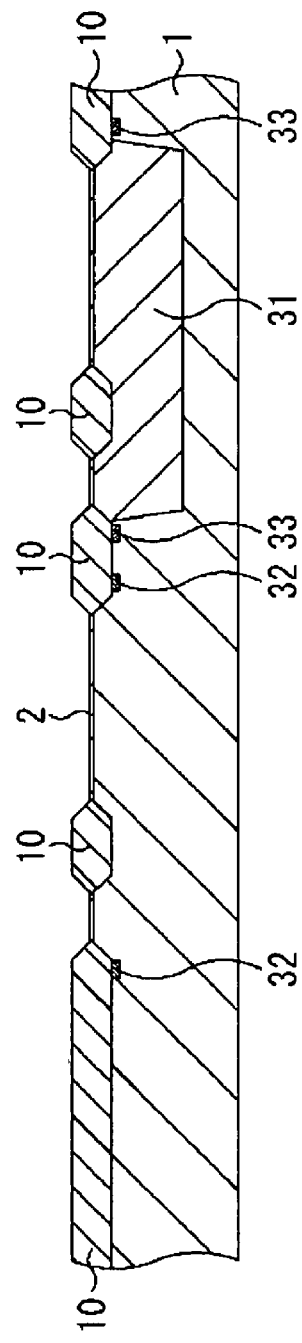

As illustrated in FIGS. 7 and 23, a field oxide film 10 having an element isolation structure for defining each active region is formed. The oxide film 2' exposed on the semiconductor substrate 1 is oxidized at, for example, 1,000° C. As a result, the field oxide film 10 having a thickness of, for example, about 400 nm is formed in the element isolation regions on the semiconductor substrate 1. The nitride film 3 is then removed. The surface of sites from which the nitride film 3 is removed is reoxidized at, for example, 950° C. to form an oxide film 2 having a thickness of about 30 nm.

Figure 8:
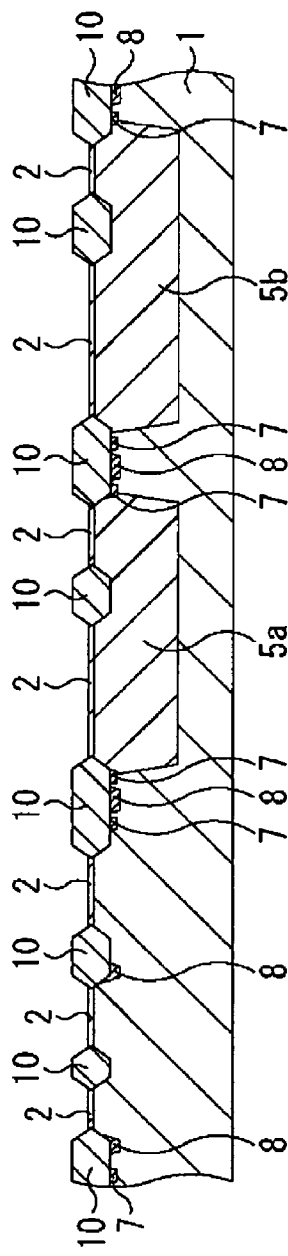
Figure 24:
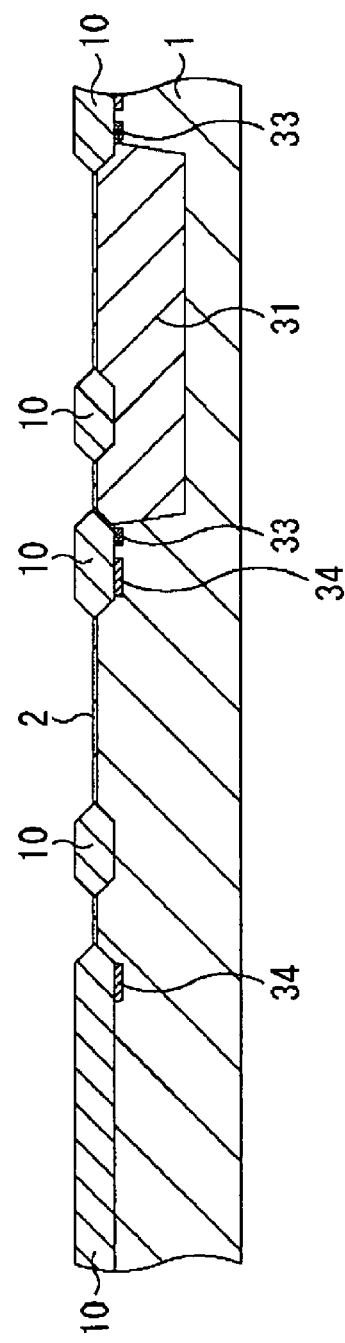

As illustrated in FIGS. 8 and 24, a resist mask (not illustrated) for opening sites where a channel stop region is to be formed in the element regions of the LDMOSFETs and the CMOSFET is formed by application of a resist and lithography. Next, a p-type impurity, for example, boron (B+) is ion-implanted using the resist mask under conditions of an acceleration energy of 160 keV and a dose of $8.0 \times 10^{13}/cm^2$. Accordingly, a channel stop region 8 is formed in the element regions of the LDMOSFETs, and a channel stop region 34 is formed in the element region of the CMOSFET. The channel stop region 34 is formed so as to overlap with the channel stop region 32. The resist mask is then removed by ashing or the like.

Figure 9:
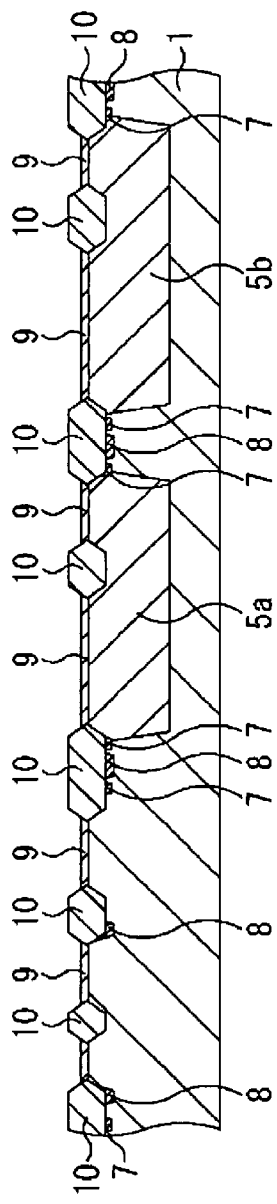

As illustrated in FIGS. 9 and 25, a thick gate insulating film 9 is formed. The oxide film 2 exposed on the semiconductor substrate 1 is removed by wet etching or the like. The surface of the semiconductor substrate 1 exposed by removing the oxide film 2 is thermally oxidized at, for example, 1,000° C. to form a relatively thick gate insulating film 9 having a thickness of, for example, about 50 nm.

As illustrated in FIG. 26, a well 35 is formed in the element region of the CMOSFET. A resist is applied to the entire surface of the semiconductor substrate 1, and the resist is then processed by lithography to form a resist mask 30 for opening the region where the well is to be formed. A p-type impurity, for example, boron (B+) is ion-implanted using the resist mask 30 under conditions of an acceleration energy of 160 keV and a dose of $8.0 \times 10^{12}/cm^2$. Accordingly, the well 35 is formed in the element region of the CMOSFET. The well 35 is a region where an n-channel MOSFET is formed. The resist mask 30 is then removed by ashing or the like.

Figure 10:
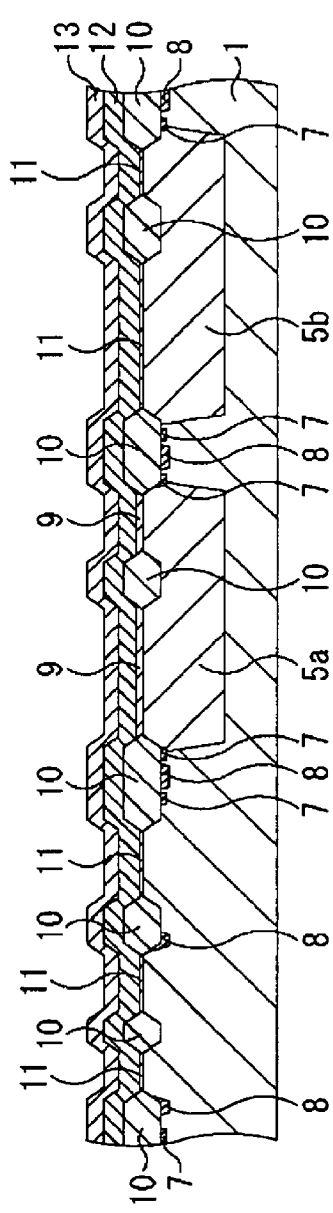

As illustrated in FIGS. 10 and 27, a thin gate insulating film 11, a polycrystalline silicon film 12, and a silicon oxide film 13 are sequentially formed. A resist mask (not illustrated), which covers a region where the thick gate insulating film 9, that is, a portion on the well 5a illustrated in FIG. 10, is formed. The gate insulating film 9 is removed by wet etching or the like so that a portion on the well 5a remains. The resist mask is removed by ashing or the like, and the surface of the semiconductor substrate 1 exposed by removing the gate insulating film 9 is then thermally oxidized at, for example, 1,000° C. As a result, a relatively thin gate insulating film 11 having a thickness smaller than that of the gate insulating film 9, for example, a thickness of about 15 nm is formed on the exposed surface of the semiconductor substrate 1. The thickness of the gate insulating film 9 is also increased by the thermal oxidation, but the increased thickness of the gate insulating film 9 is adjusted so as to be an appropriate value.

The polycrystalline silicon film 12 doped with an impurity by a CVD method or the like is formed on the entire surface of the semiconductor substrate 1. The surface of the polycrystalline silicon film 12 is thermally oxidized at, for example, 950° C. Consequently, the silicon oxide film 13 having a thickness of, for example, about 30 nm is formed on the surface of the polycrystalline silicon film 12.

Figure 11:
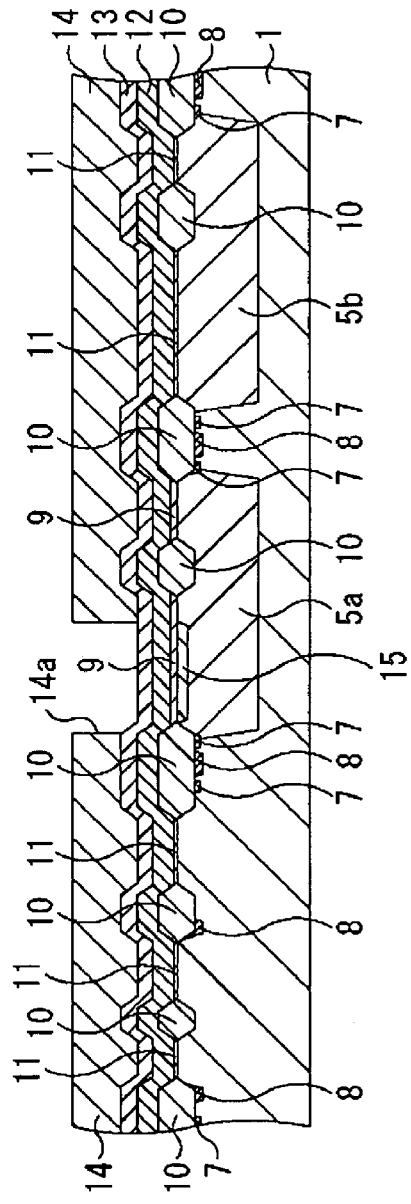

As illustrated in FIGS. 11 and 28, a p-type impurity region 15 is formed in the element region of the thick-film LDMOSFET, and a $V_{th}$ control region 36 is formed in the element region of the p-channel MOSFET. In the first embodiment, the number of processes is reduced by utilizing ion implantation for controlling the threshold of the p-channel MOSFET. The ion implantation is performed on the region where a body region of the thick-film LDMOSFET is to be formed contemporaneously.

A resist is applied to the entire surface of the semiconductor substrate 1. The resist is processed by lithography to form a resist mask 14 having openings 14a and 14b through which the regions of the wells 5a and 31 are exposed, respectively. A p-type impurity is ion-implanted using the resist mask 14. Conditions for the ion implantation, include a concentration that compensates for the insufficient concentration of the impurity in the body region of the thick-film LDMOSFET, and an acceleration energy or a dose at which the impurity passes through the silicon oxide film 13, the polycrystalline silicon film 12, and the gate insulating film 9 and reaches the surface layer of the semiconductor substrate 1. For example, boron (B+) is ion-implanted as the p-type impurity under conditions of an acceleration energy of 110 keV and a dose of $1.0 \times 10^{12}/cm^2$. By the ion implantation, the p-type impurity region 15 is formed on the surface layer of the well 5a, and the $V_{th}$ control region 36 is formed on the surface layer of the well 31. The resist mask 14 is then removed by ashing or the like.

Instead of boron (B+), boron difluoride (BF$_2$), decaborane (B$_{10}$H$_{14}$), indium (In), or the like may be used as the p-type impurity introduced in the ion implantation for forming the p-type impurity region 15. Appropriate conditions for the ion implantation include a concentration of the p-type impurity that compensates for the insufficient concentration of the impurity in the body region of the thick-film LDMOSFET, and an acceleration energy or a dose at which the impurity passes through the silicon oxide film 13, the polycrystalline silicon film 12, and the gate insulating film 9 and reaches the surface layer of the semiconductor substrate 1. Accordingly, the conditions depend on, for example, the type of p-type impurity introduced and the thicknesses of the gate insulating film 9, the polycrystalline silicon film 12, and the silicon oxide film 13. For example, when the thickness of the gate insulating film 9 is 7 nm and the thickness of the polycrystalline silicon film 12 is 50 nm, boron (B+) is ion-implanted under conditions of an acceleration energy of 30 keV and a dose of $2.0 \times 10^{12}$/cm$^2$.

Figure 12:
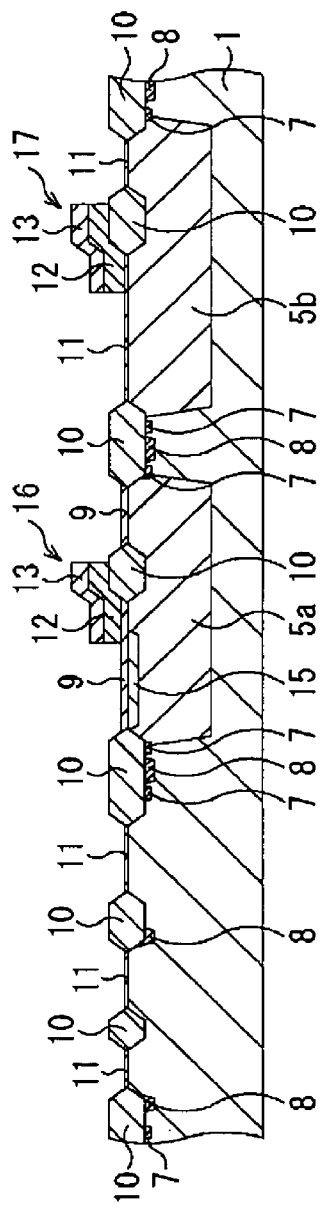

As illustrated in FIGS. 12 and 29, gate electrodes 16, 17, 37, and 38 are formed. The silicon oxide film 13 and the polycrystalline silicon film 12 are processed into an electrode shape by lithography and dry etching. The gate electrodes 16 and 17 are formed in the element regions of the LDMOSFETs, and the gate electrodes 37 and 38 are formed in the element regions of the CMOSFETs. The gate electrode 16 in which the polycrystalline silicon film 12 and the silicon oxide film 13 are laminated on the thick gate insulating film 9 is formed on the well 5a. The gate electrode 17 in which the polycrystalline silicon film 12 and the silicon oxide film 13 are laminated on the thin gate insulating film 11 is formed on the well 5b. The gate electrode 37 in which the polycrystalline silicon film 12 and the silicon oxide film 13 are laminated on the thin gate insulating film 11 is formed on the well 35. The gate electrode 38 in which the polycrystalline silicon film 12 and the silicon oxide film 13 are laminated on the thin gate insulating film 11 is formed on the well 31. After the gate electrodes 16, 17, 37, and 38 are formed, an oxide film (not illustrated) having a small thickness of, for example, about 5 nm is formed on the surface of the semiconductor substrate 1.

Since the p-type impurity region 15 is formed in a region where a body region 19a is to be formed, a part of the p-type impurity region 15 overlaps with a channel region, for example, a region under the gate electrode 16 in the well 5a. Therefore, the ion implantation of the p-type impurity region 15 is performed in a part of the channel region. In this case, transistor characteristics may be improved without degrading the on-resistance and the like, without affecting the characteristics of the thin-film LDMOSFET, and without increasing the number of processes used to form the thick-film LDMOSFET.

Figure 13:
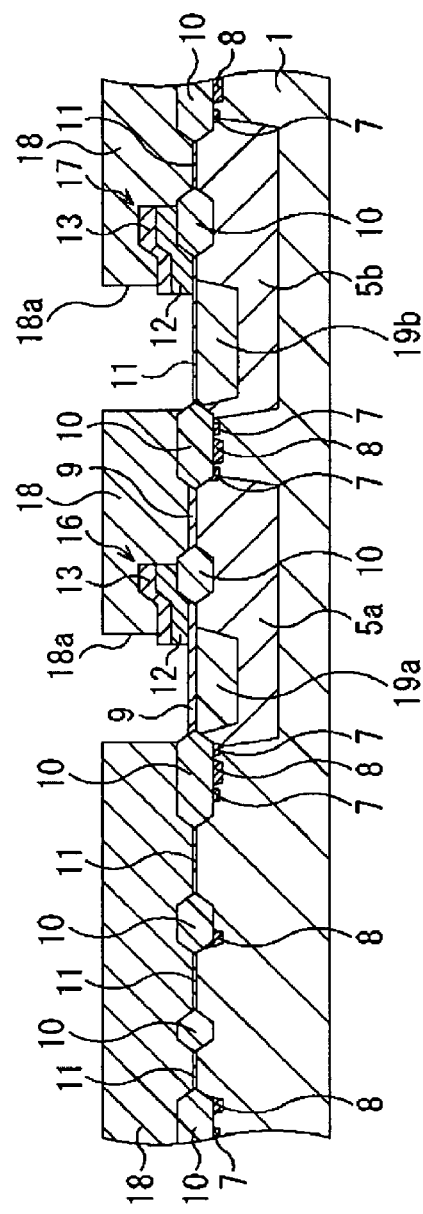

As illustrated in FIG. 13, body regions 19a and 19b are formed. A resist is applied to the entire surface of the semiconductor substrate 1. The resist is processed by lithography to form a resist mask 18 having openings 18a through which regions where the body regions of the wells 5a and 5b are to be formed are exposed.

A p-type impurity, for example, boron (B+) is ion-implanted in two stages using the resist mask 18. The impurity concentrations of the ion implantation are determined so as to be optimum for the body region of the thin-film LDMOSFET. The ion implantation in a first stage includes conditions of an acceleration energy of 60 keV and a dose of $1.0 \times 10^{13}$/cm$^2$. The ion implantation in a second stage includes conditions of an acceleration energy of 15 keV and a dose of $1.0 \times 10^{13}$/cm$^2$.

Subsequently, the resist mask 18 is removed by ashing or the like. The semiconductor substrate 1 is annealed, for example, at 1050° C. for 60 minutes. The body region 19a integrated with the p-type impurity region 15 is formed in the well 5a, and the body region 19b is formed in the well 5b.

The impurity concentrations of the ion implantation in the two stages are determined so as to be optimum for the body region of the thin-film LDMOSFET. Therefore, the body region 19b is optimum for the thin-film LDMOSFET. The p-type impurity region 15 is formed in advance in the region where the body region 19a is to be formed. Therefore, the p-type impurity region 15 and the body region 19a are integrated with each other to compensate for the impurity concentration. In the first embodiment where the body region 19a has an impurity concentration higher than that of the body region 19b, conditions for forming a body region that are optimum for the body region of the thin-film LDMOSFET are selected. Consequently, the switching speed may increase, and the body region of the thick-film LDMOSFET having an optimum impurity concentration may be formed without increasing the number of processes.

Figure 14:
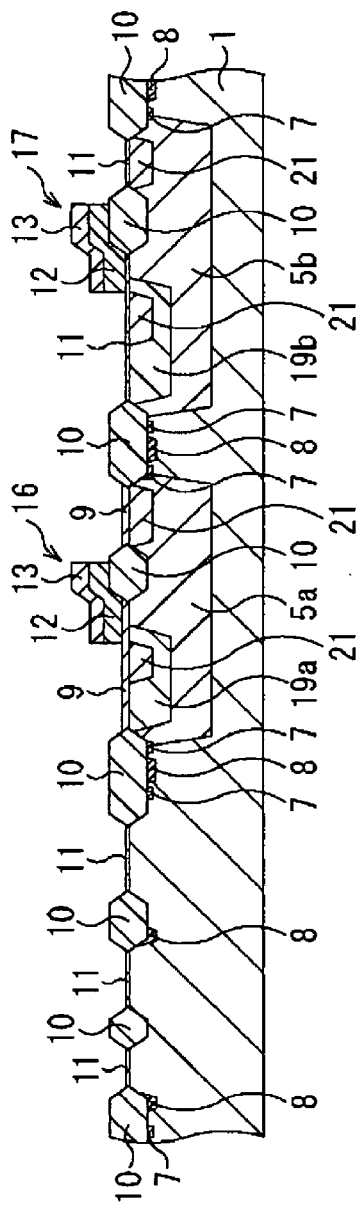

As illustrated in FIG. 14, an n-type impurity region 21 functioning as an offset region is formed. A resist mask (not illustrated) is formed on the semiconductor substrate 1. An n-type impurity, for example, phosphorus (P+) is ion-implanted at both sides of each of the gate electrodes 16 and 17 on the semiconductor substrate 1 under conditions of an acceleration energy of 100 keV and a dose of $2.0 \times 10^{12}$/cm$^2$. The n-type impurity regions 21 are formed at both sides (one side being disposed in the body region 19a or 19b) of each of the gate electrodes 16 and 17 on the semiconductor substrate 1. N-type impurity regions (not illustrated) functioning as offset regions are also formed contemporaneously in predetermined sites of the element regions of the CMOSFETs.

As illustrated in FIG. 30, LDD regions 39 and 41 are sequentially formed. A resist mask (not illustrated) having openings through which the wells 5a, 5b, and 35 are exposed is formed on the semiconductor substrate 1. An n-type impurity, for example, phosphorus (P+) is ion-implanted using the resist mask under conditions of an acceleration energy of 60 keV and a dose of $2.0 \times 10^{13}$/cm$^2$. The LDD regions are formed at both sides of each of the gate electrodes 16 and 17 of the wells 5a and 5b, respectively. The LDD regions 39 are formed at both sides of the gate electrode 37 of the well 35. Only the LDD regions 39 are illustrated in FIG. 30, and illustration of the LDD regions at both sides of each of the gate electrodes 16 and 17 are omitted. The resist mask is then removed by ashing or the like.

A resist mask (not illustrated) having an opening through which the well 31 is exposed is formed on the semiconductor substrate 1. A p-type impurity, for example, boron difluoride (BF+) is ion-implanted using the resist mask under conditions of an acceleration energy of 60 keV and a dose of $1.0 \times 10^{13}$/cm$^2$. The LDD regions 41 are formed at both sides of the gate electrode 38 of the well 31. The resist mask is then removed by ashing or the like.

Figure 15:
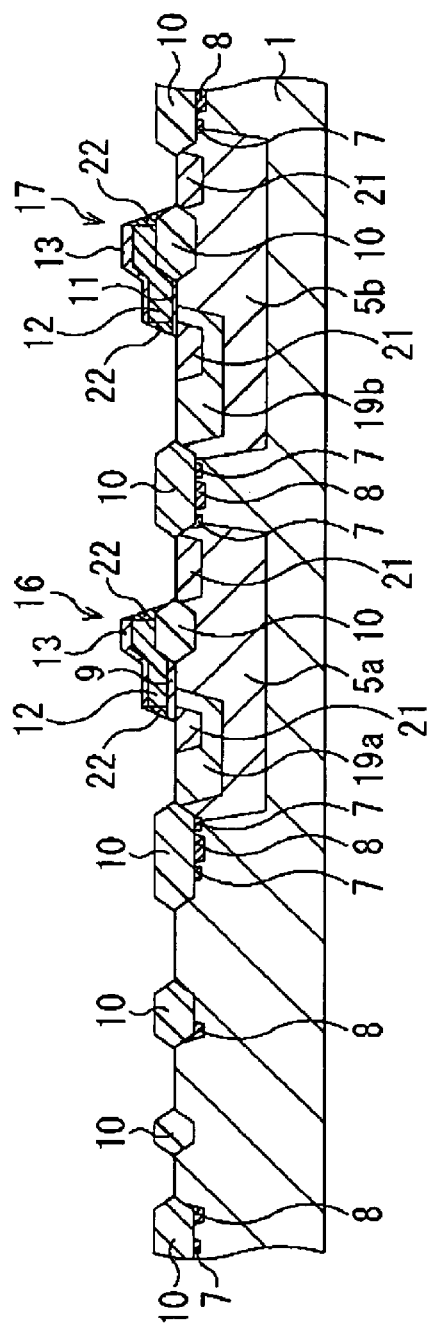
Figure 31:
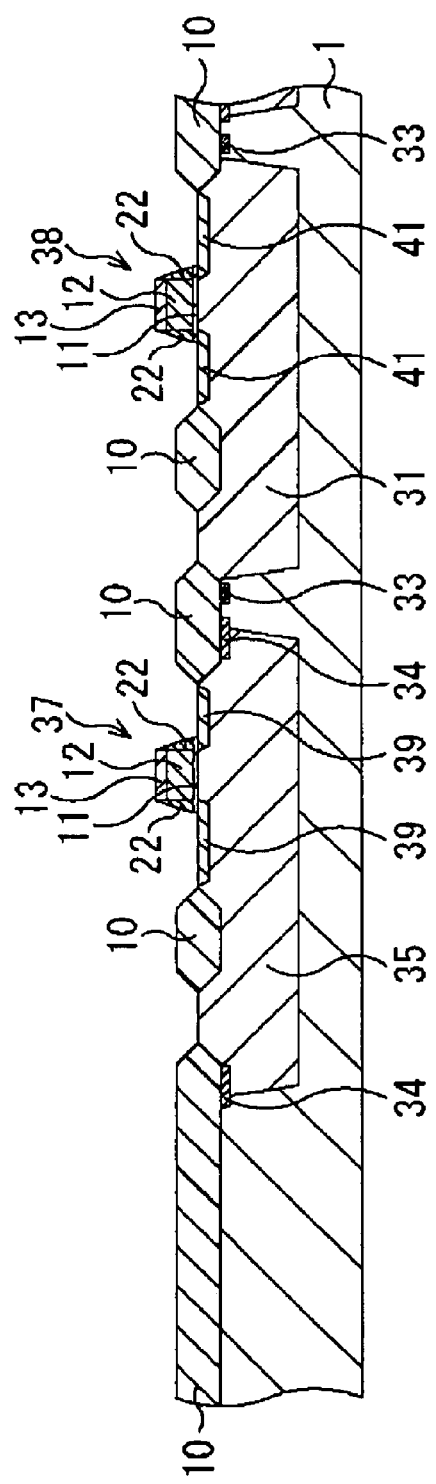

As illustrated in FIGS. 15 and 31, a sidewall insulating film 22 is formed. An insulating film, for example, a silicon oxide film (not illustrated) is deposited on the entire surface of the semiconductor substrate 1 by a CVD method or the like so as to have a thickness of about 120 nm. A resist mask (not illustrated) having openings through which the gate electrodes 17, 37, and 38 are exposed is formed on the silicon oxide film. The portions of the silicon oxide film and the thin gate insulating film 11, which are exposed through the openings of the resist mask, are removed using the resist mask by anisotropic dry etching (etch back). Consequently, the silicon oxide film remains on a part of the gate insulating film 11 and both side surfaces of each of the gate electrodes 17, 37, and 38. The sidewall insulating film 22 covering both side surfaces of each of the gate electrodes 17, 37, and 38 is formed. The resist mask is then removed by ashing or the like.

A resist mask (not illustrated) having an opening through which the gate electrode 16 is exposed is formed on the silicon oxide film. The portions of the silicon oxide film and the thick gate insulating film 9, which are exposed through the opening of the resist mask, is removed using the resist mask by anisotropic dry etching (etch back). Consequently, the silicon oxide film remains on a part of the gate insulating film 9 and both side surfaces of the gate electrode 16. The sidewall insulating film 22 covering both side surfaces of the gate electrode 16 is formed. The resist mask is then removed by ashing or the like. Subsequently, an oxide film (not illustrated) having a small thickness of, for example, about 5 nm is formed on the surface of the semiconductor substrate 1.

Figure 16:
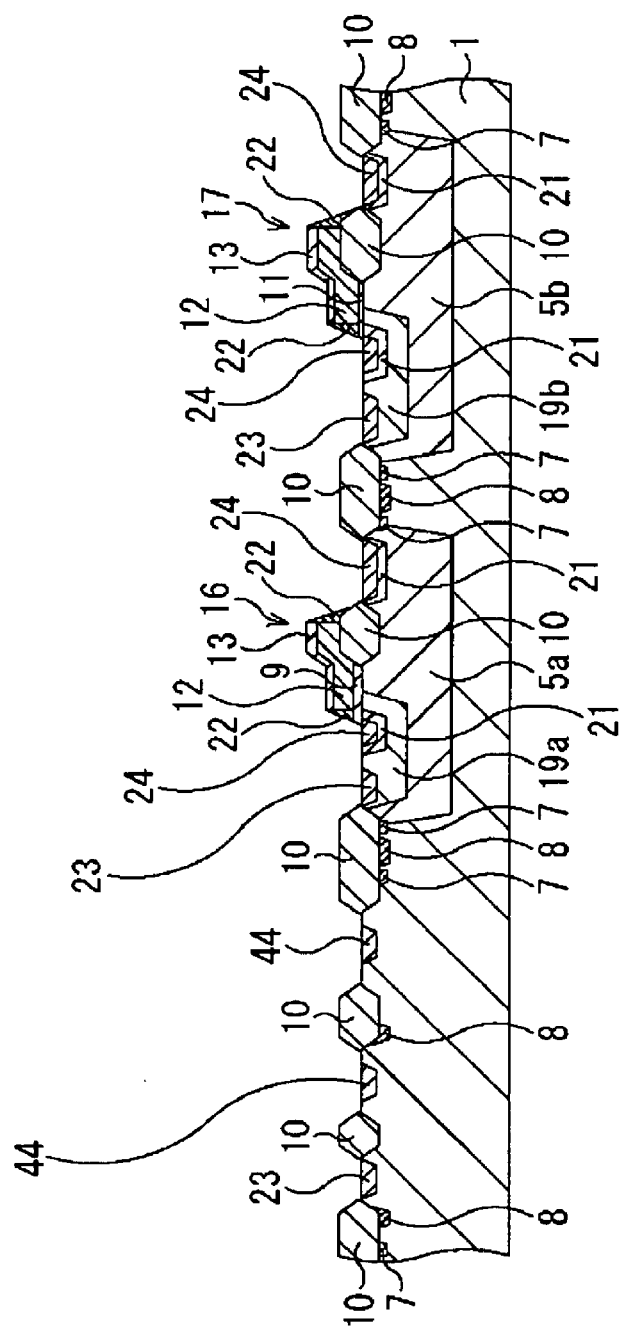
Figure 32:
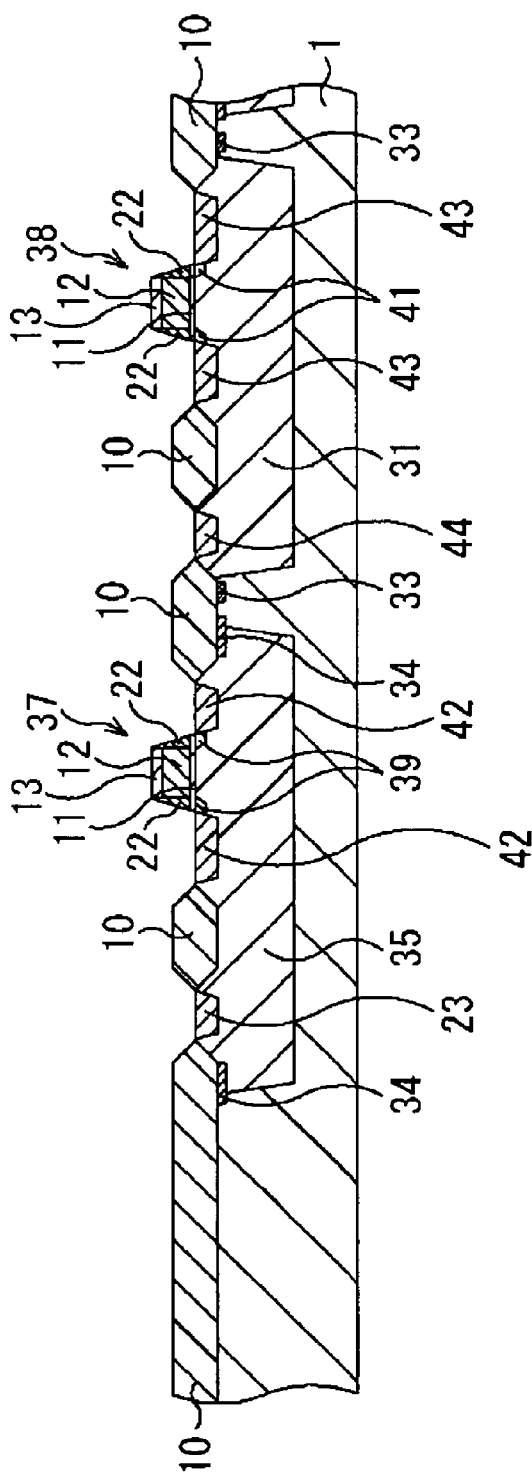

As illustrated in FIGS. 16 and 32, source/drain regions 24, 42, and 43, a p-type impurity region 23, and an n-type impurity region 44 are sequentially formed. A resist is applied to the entire surface of the semiconductor substrate 1. The resist is processed by lithography to form a resist mask (not illustrated) having openings through which regions where the p-type impurity region 23 is to be formed, the gate electrode 38, and peripheral portions of the gate electrode 38 are exposed. A p-type impurity, for example, boron difluoride (BF+) is ion-implanted using the resist mask under conditions of an acceleration energy of 20 keV and a dose of $3.0 \times 10^{15}/cm^2$. The resist mask is then removed by ashing or the like.

A resist is applied to the entire surface of the semiconductor substrate 1. The resist is processed by lithography to form a resist mask (not illustrated) having openings through which regions where the n-type impurity region 44 is to be formed, the gate electrodes 16, 17, and 37, and peripheral portions of the gate electrodes 16, 17, and 37 are exposed. An n-type impurity, for example, arsenic (As+) is ion-implanted using the resist mask under conditions of an acceleration energy of 30 keV and a dose of $1.0 \times 10^{15}/cm^2$. The resist mask is then removed by ashing or the like.

The semiconductor substrate 1 is annealed, for example, at 1,050° C. for 10 seconds. The p-type impurity region 23 and the n-type impurity region 44 are formed on the semiconductor substrate 1. The source/drain region 24 is formed at both sides (in the n-type impurity region 21) of each of the gate electrodes 16 and 17. The source/drain region (well contact region) 42 is formed at both sides of the gate electrode 37. The source/drain region (well contact region) 43 is formed at both sides of the gate electrode 38.

Figure 17:
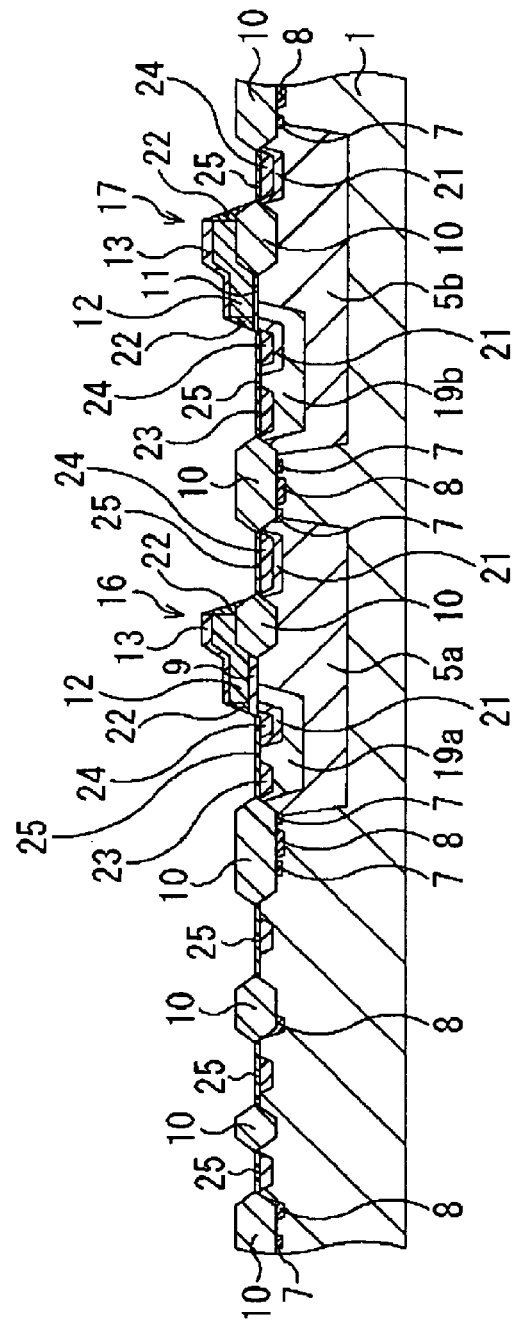
Figure 33:
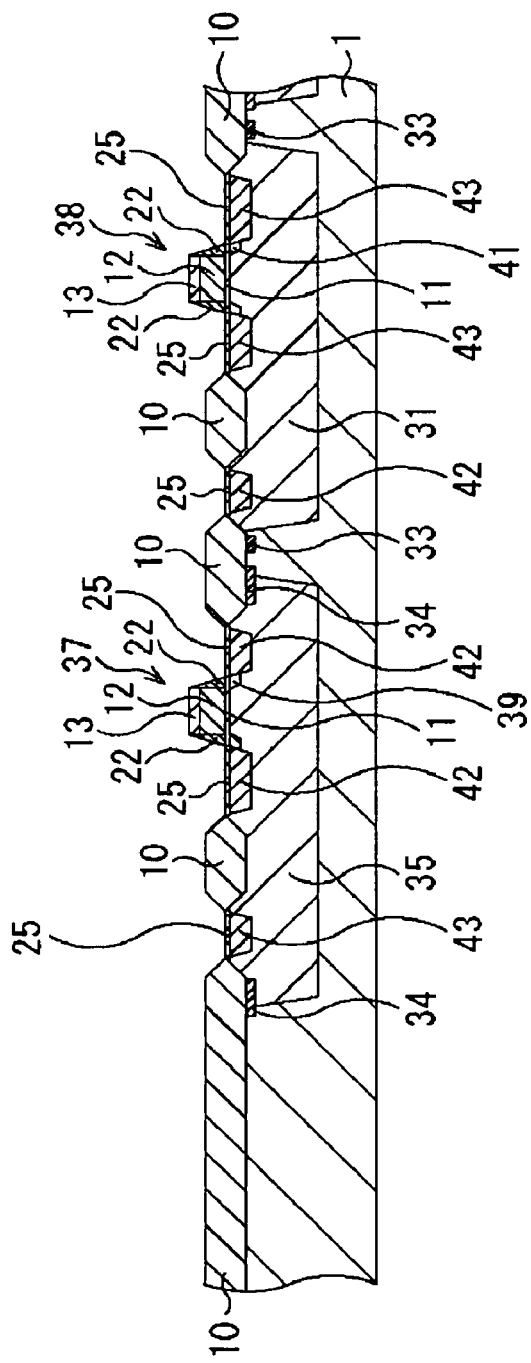

As illustrated in FIGS. 17 and 33, a silicide layer 25 is formed. A silicide metal, for example, titanium (Ti: not illustrated) is deposited by a sputtering method or the like so as to have a film thickness of about 33 nm. Instead of Ti, for example, cobalt (Co) may also be used.

The semiconductor substrate 1 is annealed, for example, at 750° C. for 90 seconds. Titanium reacts with silicon to produce titanium silicide (TiSi). Unreacted Ti is removed by wet etching or the like, and the semiconductor substrate 1 is annealed again, for example, at 850° C. for 30 seconds. The silicide layer 25 is formed on the semiconductor substrate 1.

Figure 18:
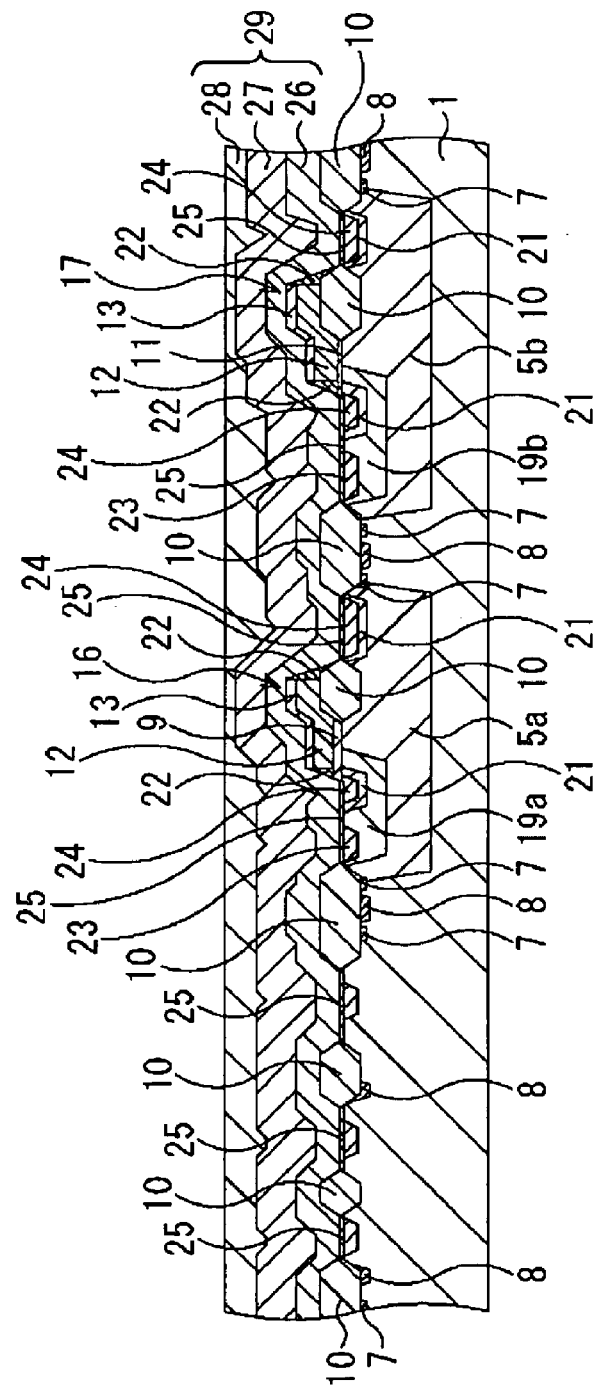
Figure 34:
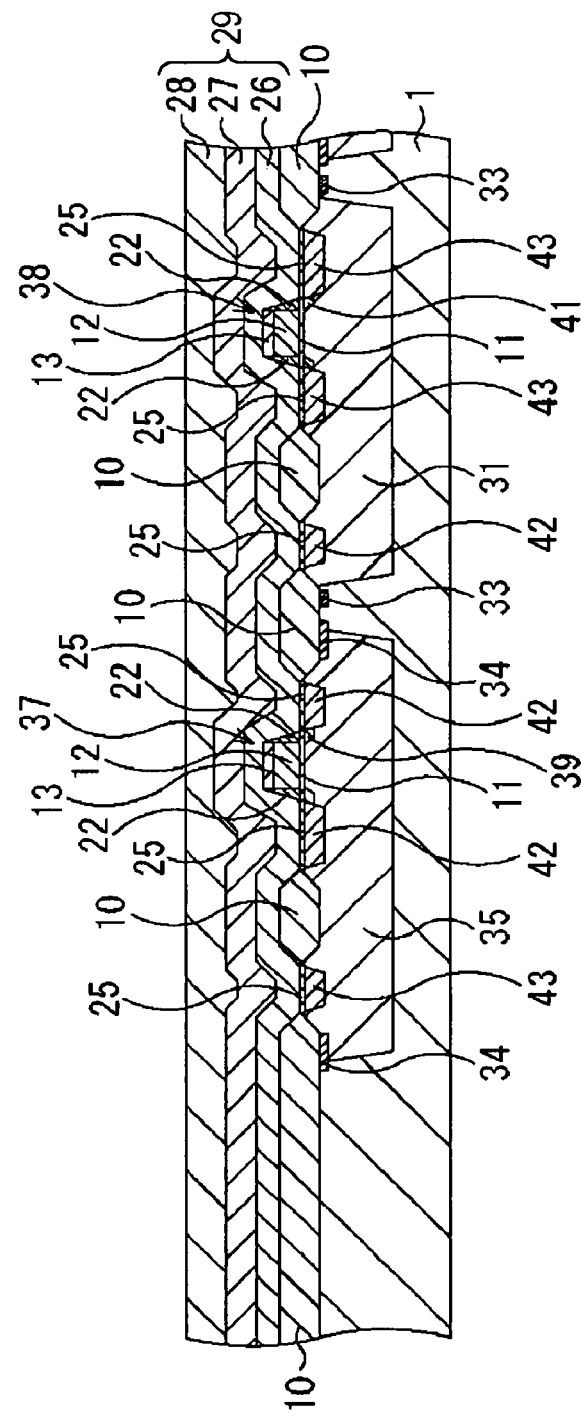

As illustrated in FIGS. 18 and 34, an interlayer insulating film 29 is formed. An insulating film, for example, a silicon oxynitride film (SiON film) 26 having a thickness of, for example, about 200 nm is deposited by a CVD method or the like so as to cover the entire surface of the semiconductor substrate 1. An insulating film, for example, a silicon oxide film (SiO film) 27 having a thickness of, for example, about 300 nm is deposited on the SiON film 26 by a CVD method or the like. A spin-on-glass film (SOG film) 28 having a thickness of, for example, about 240 nm is deposited on the SiO film 27 by an SOG method. The semiconductor substrate 1 is heat-treated, for example, at 450° C. for 30 minutes, and the surface of the SOG film 28 is then planarized. The interlayer insulating film 29 in which the SiON film 26, the SiO film 27, and the SOG film 28 are laminated is formed.

Subsequently, contact holes or the like are formed in the interlayer insulating film 29, and various types of wiring are formed, thus manufacturing the semiconductor device.

FIGS. 35 to 50 illustrate a second embodiment. FIGS. 35 to 50 illustrate element regions of p-channel LDMOSFETs. CMOSFETs formed on the substrate that includes the p-channel LDMOSFETs thereon is the same as or similar to the CMOSFETs illustrated in FIGS. 19 to 34.

Figure 35:
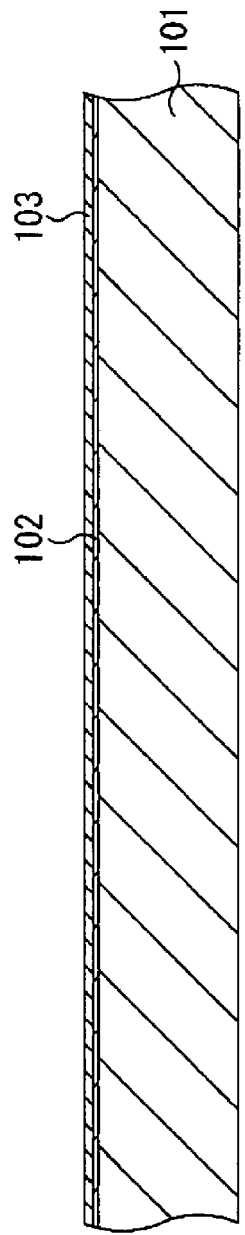
FIGS. 35-50 illustrate a manufacturing method according to a second embodiment.

As illustrated in FIG. 35, an oxide film 102 is formed on a semiconductor substrate 101, and a nitride film 103 is formed on the oxide film 102. Specifically, a surface of a semiconductor substrate such as a silicon wafer, for example, the n-type semiconductor substrate 101 is thermally oxidized to form the oxide film 102 having a thickness of, for example, about 5 nm. A silicon nitride film is then deposited on the oxide film 102 by a CVD method or the like to form the nitride film 103 having a thickness of about 100 nm.

Figure 36:
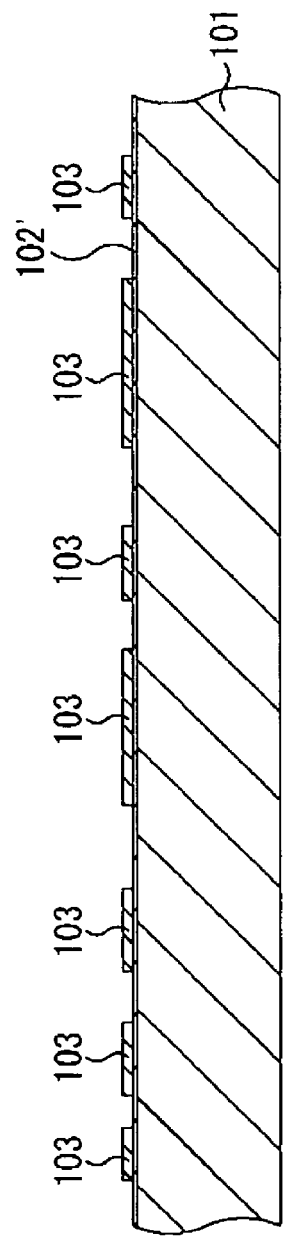

As illustrated in FIG. 36, the nitride film 103 and the oxide film 102 are processed. The nitride film 103 and the oxide film 102 are processed by lithography and dry etching so that element isolation regions are opened. The surface of the semiconductor substrate 101 exposed through the opening portions is thermally oxidized to form an oxide film 102' having a thickness of, for example, about 15 nm.

Figure 37:
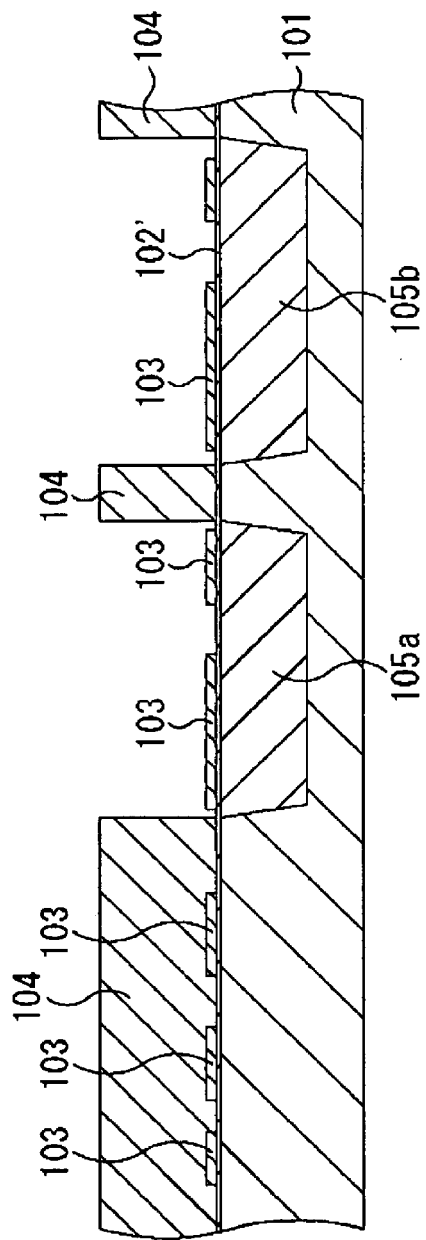

As illustrated in FIG. 37, a resist mask 104 is formed. Wells 105a and 105b are formed using the resist mask 104. Specifically, first, a resist is applied to the entire surface of the semiconductor substrate 101. The resist is processed by lithography to form the resist mask 104 for opening regions where the wells are to be formed. A p-type impurity, for example, boron (B+) is ion-implanted using the resist mask 104 under conditions of an acceleration energy of 160 keV and a dose of $4.0 \times 10^{12}/cm^2$. The wells 105a and 105b are formed in the element regions of the LDMOSFETs. A p-type well (not illustrated) is formed in an element region of a CMOSFET. The well 105a becomes a region where a thick-film LDMOSFET including a gate insulating film having a large thickness is formed. The well 105b becomes a region where a thin-film LDMOSFET including a gate insulating film having a thickness smaller than the thickness of the thick-film LDMOSFET is formed. The p-type well becomes a region where an n-channel MOSFET is formed. The resist mask 104 is then removed by ashing or the like.

Figure 38:
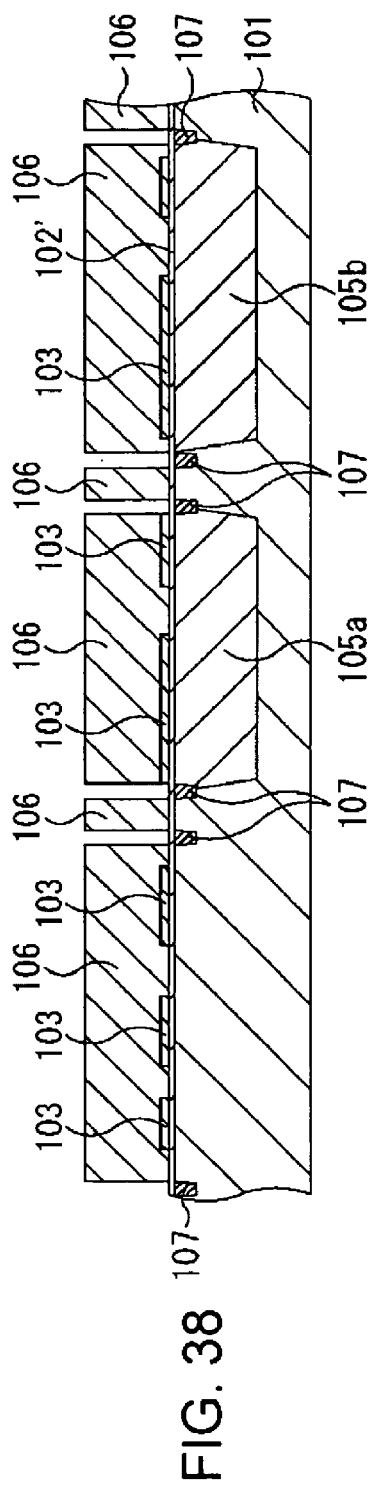

As illustrated in FIG. 38, a channel stop region 107 is formed in the element regions of the LDMOSFETs, and channel stop regions (not illustrated) are formed in the element regions of the CMOSFETs. A resist mask 106 for opening sites where the channel stop region is to be formed in the element regions of the LDMOSFETs is formed on the semiconductor substrate 101 by application of a resist and lithography. Next, a p-type impurity, for example, boron (B+) is ion-implanted using the resist mask 106 under conditions of an acceleration energy of 60 keV and a dose of $2 \times 10^{13}/cm^2$. Accordingly, the channel stop region 107 is formed in the element regions of the LDMOSFETs. The resist mask 106 is then removed by ashing or the like.

A resist mask (not illustrated) for opening sites where a channel stop region is to be formed in the element region of one of the CMOSFETs is formed on the semiconductor substrate 101 by application of a resist and lithography. Next, a p-type impurity, for example, boron (B+) is ion-implanted using the resist mask. Accordingly, the channel stop region is formed in the element region of the CMOSFET. The resist mask is then removed by ashing or the like.

A resist mask (not illustrated) for opening sites where a channel stop region is to be formed in the element region of the other of the CMOSFETs is formed on the semiconductor substrate 101 by application of a resist and lithography. An n-type impurity, for example, phosphorus (P+) is ion-implanted using the resist mask. Accordingly, the channel stop region is formed in the element region of the CMOSFET. The resist mask is then removed by ashing or the like.

Figure 39:
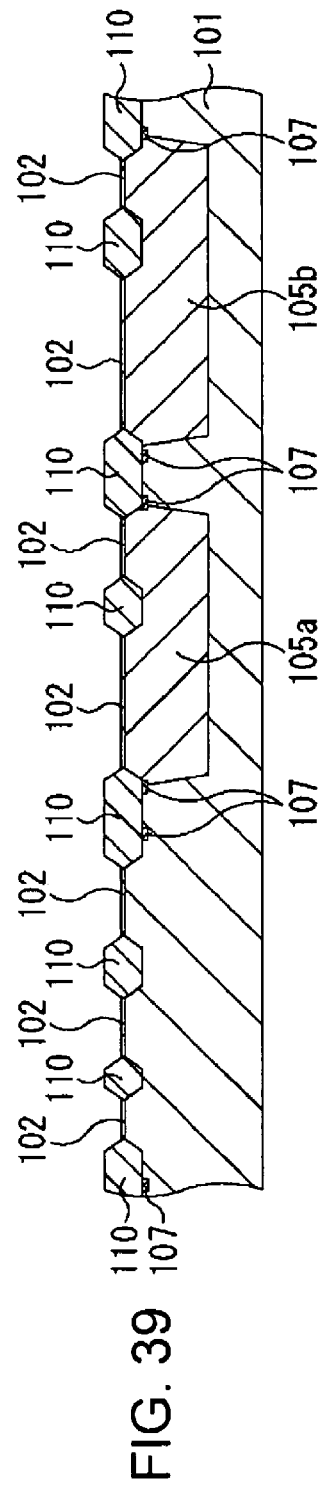

As illustrated in FIG. 39, a field oxide film 110 having an element isolation structure for defining each active region is formed. The oxide film 102' exposed on the semiconductor substrate 101 is field-oxidized at, for example, 1,000° C. As a result, the field oxide film 110 having a thickness of about 400 nm is formed in the element isolation regions on the semiconductor substrate 101. The nitride film 103 is then removed. The surface of sites from which the nitride film 103 is removed is reoxidized at, for example, 950° C. to form an oxide film 102 having a thickness of, for example, about 30 nm.

Figure 40:
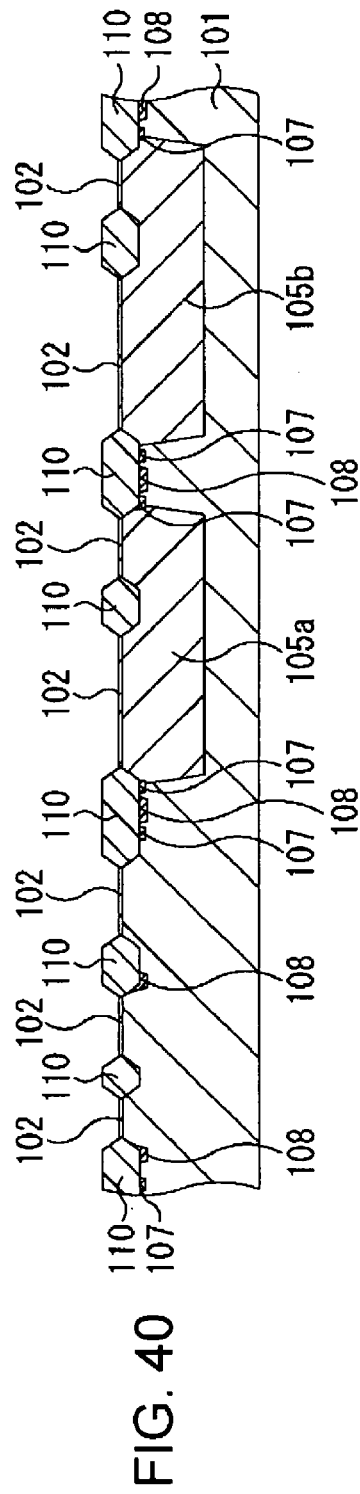

As illustrated in FIG. 40, a resist mask (not illustrated) for opening sites where a channel stop region is to be formed in the element regions of the LDMOSFETs and the CMOSFET is formed by application of a resist and lithography. An n-type impurity, for example, phosphorus (P+) is ion-implanted using the resist mask under conditions of an acceleration energy of 200 keV and a dose of $5.0 \times 10^{13}/\text{cm}^2$. Accordingly, a channel stop region 108 is formed in the element regions of the LDMOSFETs, and a channel stop region (not illustrated) is formed in the element region of the CMOSFET. The resist mask is then removed by ashing or the like.

Figure 41:
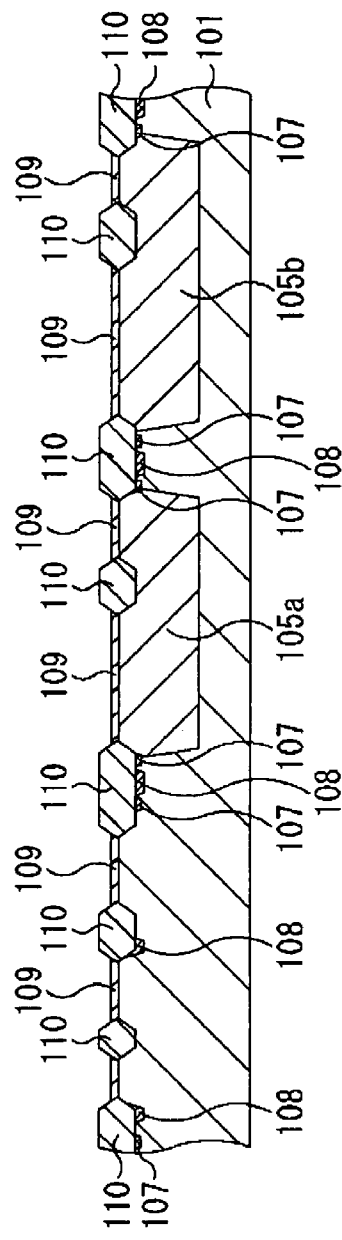

As illustrated in FIG. 41, a thick gate insulating film 109 is formed. The oxide film 102 exposed on the semiconductor substrate 101 is removed by wet etching or the like. The surface of the semiconductor substrate 101 exposed by removing the oxide film 102 is thermally oxidized at, for example, 1,000° C. to form a relatively thick gate insulating film 109 having a thickness of, for example, about 50 nm.

A well (not illustrated) is formed in the element region of the CMOSFET. A resist is applied to the entire surface of the semiconductor substrate 101, and the resist is then processed by lithography to form a resist mask (not illustrated) for opening the region where the well is to be formed. An n-type impurity, for example, phosphorus (P+) is ion-implanted using the resist mask. Accordingly, an n-type well is formed in the element region of the CMOSFET. The n-type well becomes a region where a p-channel MOSFET is formed. The resist mask is then removed by ashing or the like.

Figure 42:
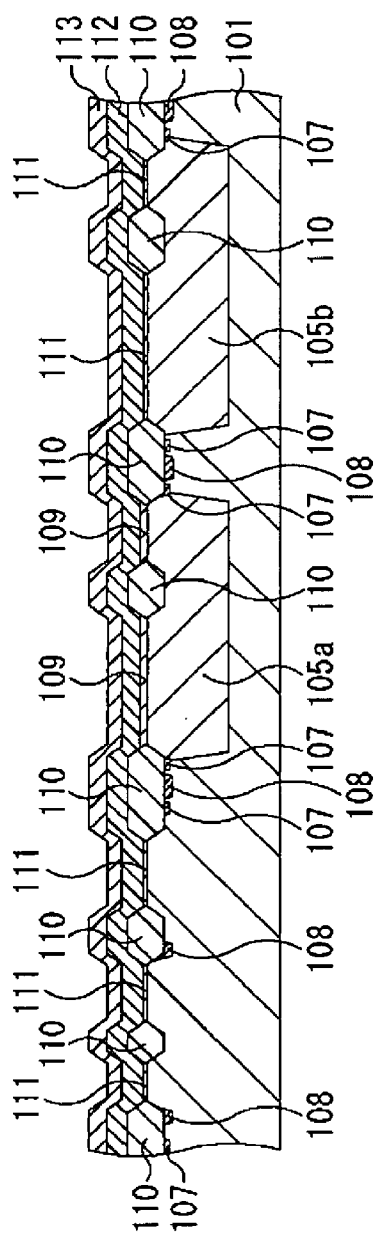

As illustrated in FIG. 42, a thin gate insulating film 111, a polycrystalline silicon film 112, and a silicon oxide film 113 are sequentially formed. A resist mask (not illustrated), which covers a region where the thick gate insulating film 109 is formed, that is, a portion of the gate insulating film 109 disposed on the well 105a illustrated in FIG. 42, is formed. The gate insulating film 109 is removed by wet etching or the like so that the portion of the gate insulating film 109 disposed on the well 105a remains. The resist mask is removed by ashing or the like, and the surface of the semiconductor substrate 101 exposed by removing the gate insulating film 109 is then thermally oxidized at, for example, 1,000° C. As a result, a relatively thin gate insulating film 111 having a thickness smaller than that of the gate insulating film 109, for example, a thickness of about 15 nm is formed on the exposed surface of the semiconductor substrate 101. The thickness of the gate insulating film 109 is also increased by the thermal oxidation, but the increased thickness of the gate insulating film 109 is adjusted so as to be an appropriate value.

The polycrystalline silicon film 112 doped with an impurity is deposited by a CVD method or the like on the entire surface of the semiconductor substrate 101. The surface of the polycrystalline silicon film 112 is thermally oxidized at, for example, 950° C. Consequently, the silicon oxide film 113 having a thickness of, for example, about 30 nm is formed on the surface of the polycrystalline silicon film 112.

Figure 43:
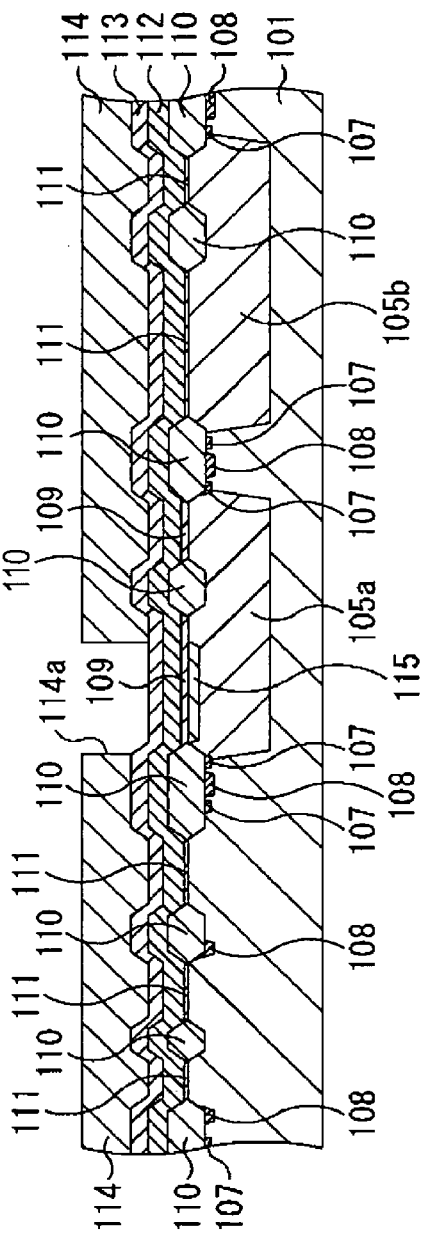

As illustrated in FIG. 43, an n-type impurity region 115 is formed in the element region of the thick-film LDMOSFET, and a $V_{th}$ control region (not illustrated) is formed in the element region of the n-channel MOSFET. In the second embodiment, ion implantation for controlling the threshold of the n-channel MOSFET is also performed in the region where a body region of the thick-film LDMOSFET is to be formed. Thereby, the number of processes is reduced.

A resist is applied to the entire surface of the semiconductor substrate 101. The resist is processed by lithography to form a resist mask 114 having an opening 114a through which the region of the well 105a is exposed and an opening (not illustrated) through which a predetermined region of the n-channel MOSFET is exposed. An n-type impurity is ion-implanted using the resist mask 114. Conditions for the ion implantation, include a concentration that compensate for the insufficient concentration of the impurity in the body region of the thick-film LDMOSFET, and an acceleration energy or a dose at which the impurity passes through the silicon oxide film 113, the polycrystalline silicon film 112, and the gate insulating film 109 and reaches the surface layer of the semiconductor substrate 101. For example, phosphorus (P+) is ion-implanted as the n-type impurity under conditions of an acceleration energy of 330 keV and a dose of $1.0 \times 10^{12}/\text{cm}^2$. By the ion implantation, the n-type impurity region 115 is formed on the surface layer of the well 105a. The resist mask 114 is then removed by ashing or the like.

Instead of phosphorus (P+), arsenic (As+) or the like may be used as the n-type impurity introduced in the ion implantation for forming the n-type impurity region 115. Conditions that are appropriate for the ion implantation, include a concentration of the n-type impurity that compensate for the insufficient concentration of the impurity in the body region of the thick-film LDMOSFET, and an acceleration energy or a dose at which the impurity passes through the silicon oxide film 113, the polycrystalline silicon film 112, and the gate insulating film 109 and reaches the surface layer of the semiconductor substrate 101. Accordingly, the conditions depend on, for example, the type of n-type impurity introduced and the thicknesses of the gate insulating film 109, the polycrystalline silicon film 112, and the silicon oxide film 113. For example, when the thickness of the gate insulating film 109 is 7 nm and the thickness of the polycrystalline silicon film 112 is 50 nm, phosphorus (P+) is ion-implanted under conditions of an acceleration energy of 90 keV and a dose of $2.0 \times 10^{12}/\text{cm}^2$.

Figure 44:
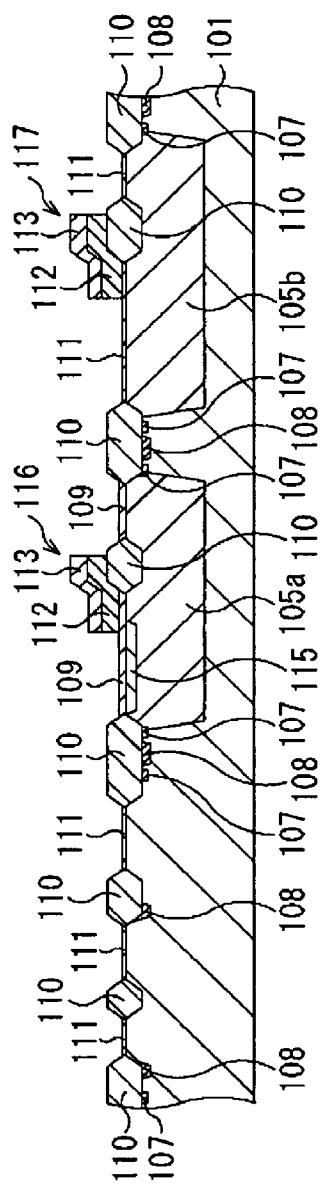

As illustrated in FIG. 44, gate electrodes 116 and 117 are formed. The silicon oxide film 113 and the polycrystalline silicon film 112 are processed into an electrode shape by lithography and dry etching. The gate electrodes 116 and 117 are formed in the element regions of the LDMOSFETs, and gate electrodes (not illustrated) are formed in the element regions of the CMOSFETs. The gate electrode 116 in which the polycrystalline silicon film 112 and the silicon oxide film 113 are laminated on the thick gate insulating film 109 is formed on the well 105a. The gate electrode 117 in which the polycrystalline silicon film 112 and the silicon oxide film 113 are laminated on the thin gate insulating film 111 is formed on the well 105b. After the gate electrodes 116 and 117 are formed, an oxide film (not illustrated) having a small thickness of, for example, about 5 nm is formed on the surface of the semiconductor substrate 101.

Since the n-type impurity region 115 is formed in substantially the same region as a body region 119a (a region where the body region 119a is to be formed), a part of the n-type impurity region 115 overlaps with a channel region, for example, a region under the gate electrode 116 in the well 105a. Therefore, the ion implantation of the n-type impurity region 115 is also performed in a part of the channel region. Transistor characteristics may be improved without degrading the on-resistance and the like, without affecting the characteristics of the thin-film LDMOSFET, and without increasing the number of processes used to form the thick-film LDMOSFET.

Figure 45:
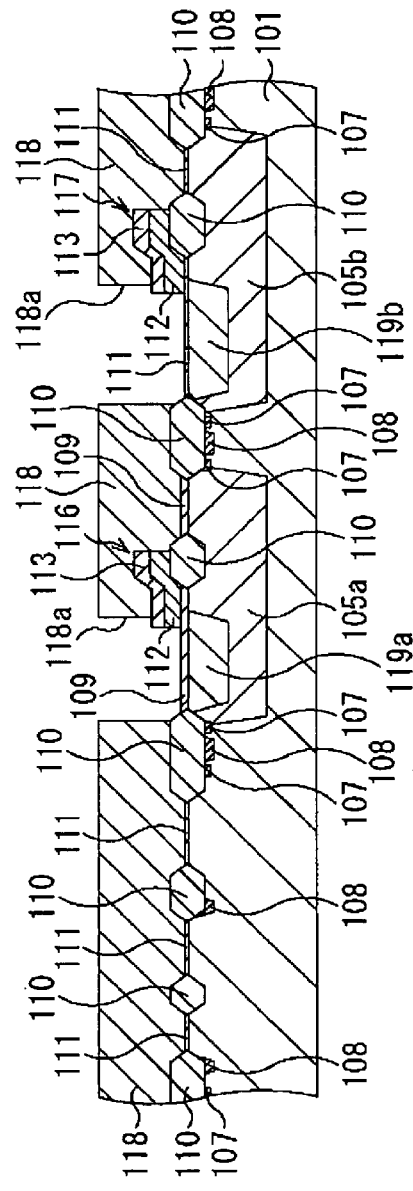

As illustrated in FIG. 45, body regions 119a and 119b are formed. A resist is applied to the entire surface of the semiconductor substrate 101. The resist is processed by lithography to form a resist mask 118 having openings 118a through which regions where the body regions of the wells 105a and 105b are to be formed are exposed.

An n-type impurity, for example, phosphorus (P+) is ion-implanted in two stages using the resist mask 118. Conditions for the ion implantation include an impurity concentration that is optimum for the body region of the thin-film LDMOSFET. For example, conditions for the ion implantation in a first stage include an acceleration energy of 160 keV and a dose of $1.0 \times 10^{13}/cm^2$. For example, conditions for the ion implantation in a second stage include an acceleration energy of 45 keV and a dose of $1.0 \times 10^{13}/cm^2$.

Subsequently, the resist mask 118 is removed by ashing or the like. The semiconductor substrate 101 is annealed, for example, at 1,050° C. for 60 minutes. The body region 119a integrated with the n-type impurity region 115 is formed in the well 105a, and the body region 119b is formed in the well 105b.

The impurity concentrations of the ion implantation in the two stages are determined so as to be optimum for the body region of the thin-film LDMOSFET. Therefore, the body region 119b is optimum for the thin-film LDMOSFET. The n-type impurity region 115 is formed in advance in the region where the body region 119a is to be formed. Therefore, the body region 119a is integrated with the n-type impurity region 115 to compensate for the impurity concentration, and thus has an impurity concentration higher than that of the body region 119b. In the second embodiment, conditions for forming a body region optimum for the body region of the thin-film LDMOSFET are selected. Consequently, the switching speed may increase, and the body region of the thick-film LDMOSFET may have an optimum impurity concentration without increasing the number of processes.

Figure 46:
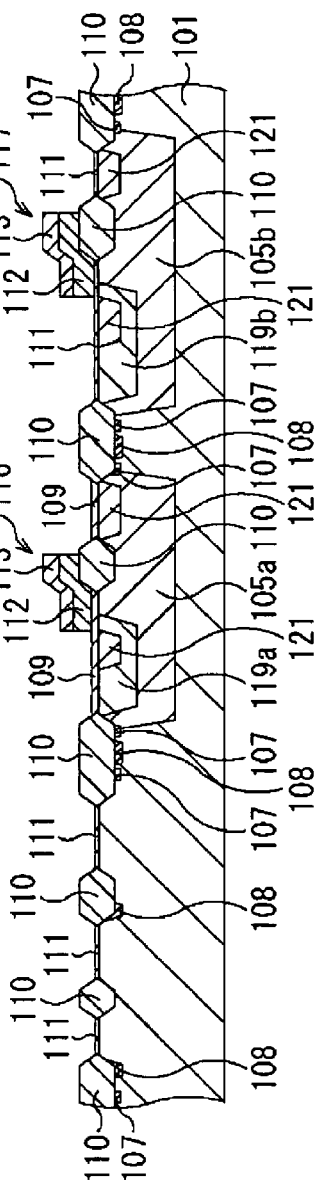

As illustrated in FIG. 46, a p-type impurity region 121 functioning as an offset region is formed. A predetermined resist mask (not illustrated) is formed on the semiconductor substrate 101. A p-type impurity, for example, boron (B+) is ion-implanted at both sides of each of the gate electrodes 116 and 117 on the semiconductor substrate 101 under conditions of an acceleration energy of 30 keV and a dose of $3.0 \times 10^{12}/cm^2$. The p-type impurity region 121 is formed at both sides (one side being disposed in the body region 119a or 119b) of each of the gate electrodes 116 and 117 on the semiconductor substrate 101. In this step, a p-type impurity region (not illustrated) functioning as an offset region is also formed contemporaneously in predetermined sites of the element regions of the CMOSFETs.

LDD regions (not illustrated) are sequentially formed in the element regions of the thin-film LDMOSFET, the thick-film LDMOSFET, and the CMOSFETs. A certain resist mask is formed on the semiconductor substrate 101. A p-type impurity, for example, boron (B+) is ion-implanted using the resist mask. P-type LDD regions are formed at both sides of each of the gate electrodes 116 and 117 of the thick-film LDMOSFET and the thin-film LDMOSFET, respectively, and both sides of the gate electrode of the CMOSFET. The resist mask is then removed by ashing or the like.

A resist mask is formed on the semiconductor substrate 101. An n-type impurity, for example, phosphorus (P+) is ion-implanted using the resist mask. N-type LDD regions are formed at both sides of the gate electrode of the other CMOSFET. The resist mask is then removed by ashing or the like.

Figure 47:
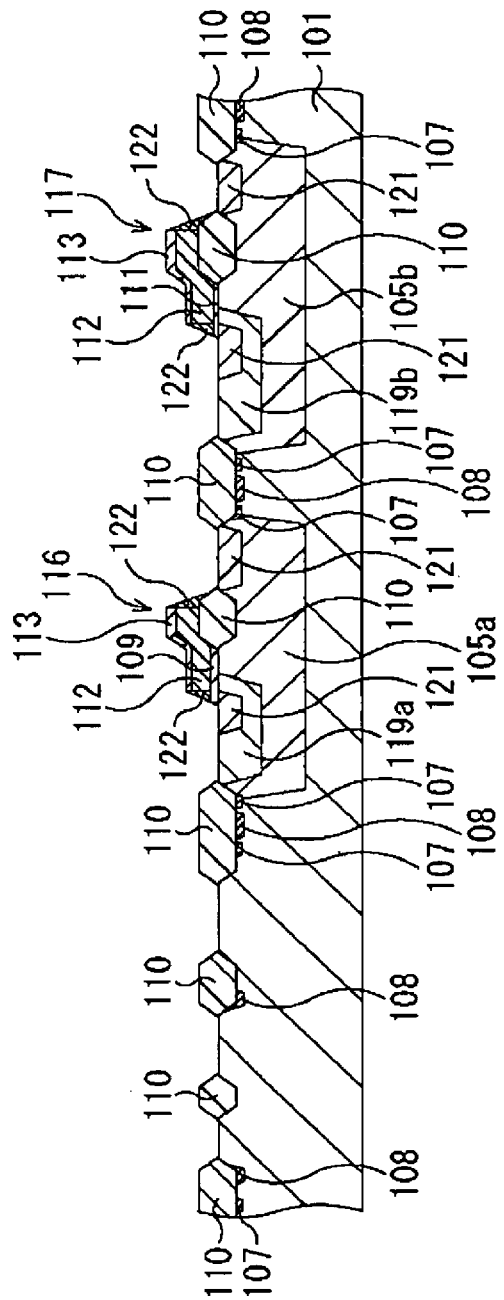

As illustrated in FIG. 47, a sidewall insulating film 122 is formed. An insulating film, for example, a silicon oxide film (not illustrated) is deposited on the entire surface of the semiconductor substrate 101 by a CVD method or the like so as to have a thickness of about 120 nm. A resist mask (not illustrated) having an opening through which the gate electrode 117 is exposed is formed on the silicon oxide film. The portions of the silicon oxide film and the thin gate insulating film 111, which are exposed through the opening of the resist mask, are removed by anisotropic dry etching (etch back). Consequently, the silicon oxide film remains on a part of the gate insulating film 111 and both side surfaces of the gate electrode 117. The sidewall insulating film 122 covering both side surfaces of the gate electrode 117 is formed. The resist mask is then removed by ashing or the like.

A resist mask (not illustrated) having an opening through which the gate electrode 116 is exposed is formed on the silicon oxide film. The portions of the silicon oxide film and the thick gate insulating film 109, which are exposed through the opening of the resist mask, are removed by anisotropic dry etching (etch back). Consequently, the silicon oxide film remains on a part of the gate insulating film 109 and both side surfaces of the gate electrode 116. The sidewall insulating film 122 covering both side surfaces of the gate electrode 116 is formed. The resist mask is then removed by ashing or the like. Subsequently, an oxide film (not illustrated) having a small thickness of, for example, about 5 nm is formed on the surface of the semiconductor substrate 101.

Figure 48:
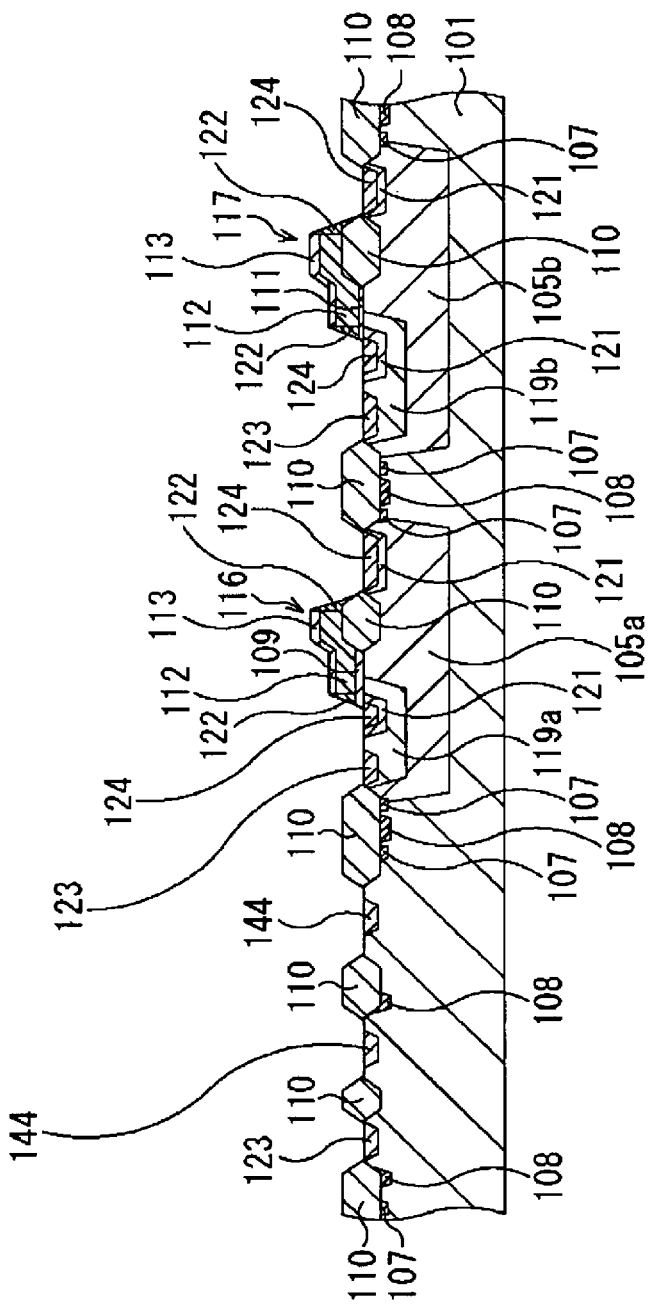

As illustrated in FIG. 48, a source/drain region 124, an n-type impurity region 123, and a p-type impurity region 144 are sequentially formed. A resist is applied to the entire surface of the semiconductor substrate 101. The resist is processed by lithography to form a resist mask (not illustrated) having openings through which regions where the n-type impurity region 123 is to be formed, the gate electrode of the n-channel MOSFET, and peripheral portions of the gate electrode are exposed. An n-type impurity, for example, arsenic (As+) is ion-implanted using the resist mask under conditions of an acceleration energy of 30 keV and a dose of $1.0 \times 10^{15}/cm^2$. The resist mask is then removed by ashing or the like.

A resist is applied to the entire surface of the semiconductor substrate 101. The resist is processed by lithography to form a resist mask (not illustrated) having openings through which regions where the p-type impurity region 144 is to be formed, the gate electrodes 116 and 117, the gate electrode of the p-channel MOSFET, and peripheral portions of the gate electrodes are exposed. A p-type impurity, for example, boron difluoride ($BF_2$) is ion-implanted using the resist mask under conditions of an acceleration energy of 20 keV and a dose of $3.0 \times 10^{15}/cm^2$. The resist mask is then removed by ashing or the like.

The semiconductor substrate 101 is annealed, for example, at 1,050° C. for 10 seconds. The n-type impurity region 123 and the p-type impurity region 144 are formed on the semiconductor substrate 101. The source/drain region 124 is formed at both sides in the p-type impurity region 121 of each of the gate electrodes 116 and 117. A p-channel source/drain region (not illustrated) is formed at both sides of the gate electrode of the p-channel MOSFET. An n-channel source/drain region (not illustrated) is formed at both sides of the gate electrode of the n-channel MOSFET.

Figure 49:
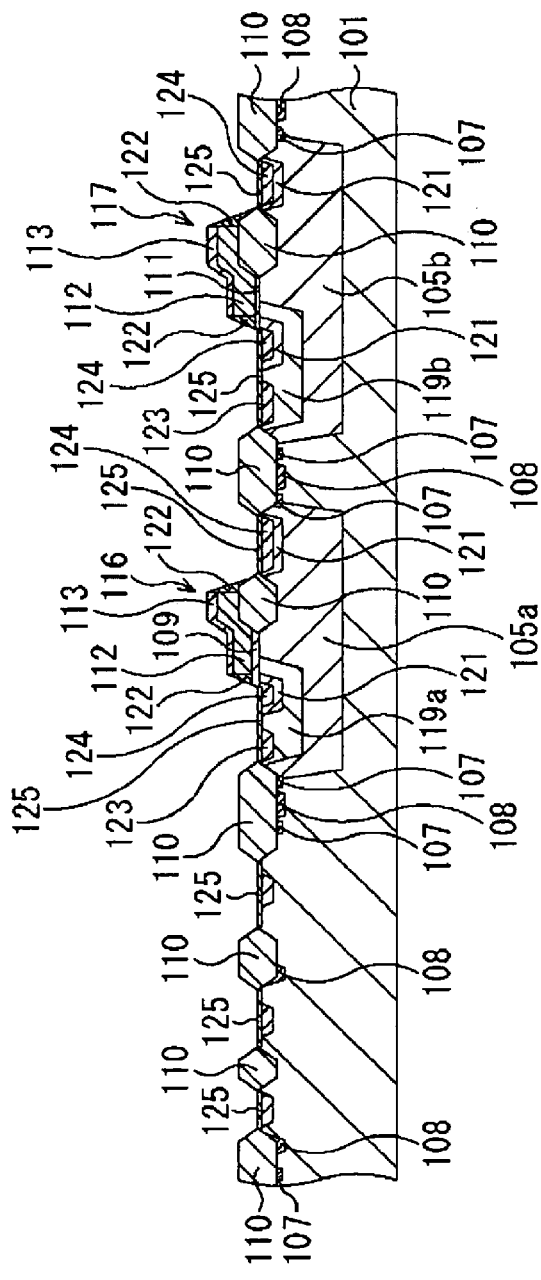

As illustrated in FIG. 49, a silicide layer 125 is formed. A silicide metal, for example, titanium (Ti: not illustrated) is deposited by a sputtering method or the like so as to have a film thickness of about 33 nm. Instead of Ti, for example, cobalt (Co) may also be used.

The semiconductor substrate 101 is annealed, for example, at 750° C. for 90 seconds. Titanium reacts with silicon to produce titanium silicide (TiSi). Unreacted Ti is removed by wet etching or the like, and the semiconductor substrate 101 is annealed again, for example, at 850° C. for 30 seconds. The silicide layer 125 is formed on the semiconductor substrate 101.

Figure 50:
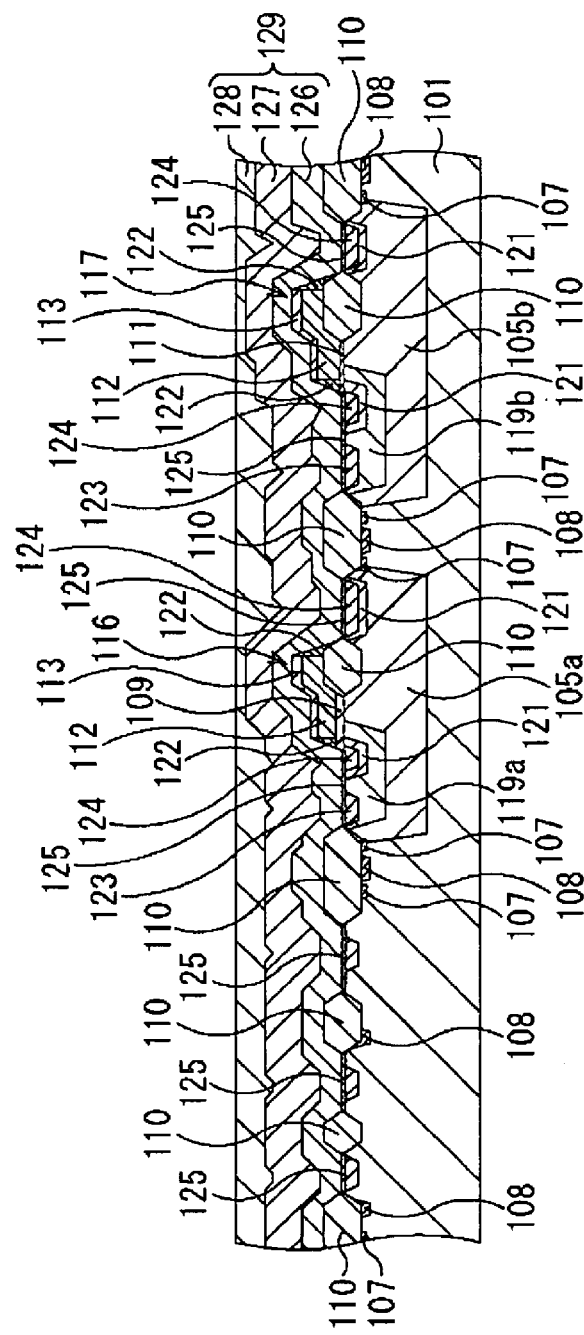

As illustrated in FIG. 50, an interlayer insulating film 129 is formed. An insulating film, for example, a silicon oxynitride film (SiON film) 126 having a thickness of, for example, about 200 nm is formed by a CVD method or the like so as to cover the entire surface of the semiconductor substrate 101. An insulating film, for example, a silicon oxide film (SiO film) 127 having a thickness of, for example, about 300 nm is formed on the SiON film 126 by a CVD method or the like. An SOG film 128 having a thickness of, for example, about 240 nm is formed on the SiO film 127 by an SOG method. The semiconductor substrate 101 is heat-treated, for example, at 450° C. for 30 minutes, and the surface of the SOG film 128 is planarized. The interlayer insulating film 129 in which the SiON film 126, the SiO film 127, and the SOG film 128 are laminated is formed.

Subsequently, contact holes or the like are formed in the interlayer insulating film 129, and various types of wiring are formed, thus manufacturing the semiconductor device.

Example embodiments of the present invention have now been described in accordance with the above advantages. It will be appreciated that these examples are merely illustrative of the invention. Many variations and modifications will be apparent to those skilled in the art.

What is claimed is:

1. A method of manufacturing a semiconductor device comprising:
forming a first gate insulating film and a second gate insulating film in an active region of a semiconductor substrate;
introducing an impurity of a first conductivity type into a first site where a first body region is to be formed, the first site being disposed under the first gate insulating film in the active region;
forming a gate electrode on each of the first gate insulating film and the second gate insulating film; and
introducing an impurity of the first conductivity type into the first site and a second site where a second body region is to be formed, the second site being disposed under the second gate insulating film in the active region, to form the first body region and the second body region, respectively, and
wherein the impurity is introduced into the first site and a channel region of a transistor of a second conductivity type contemporaneously.

2. The method according to claim 1, further comprising:
depositing a gate electrode material on the first gate insulating film and the second gate insulating film;
introducing the impurity to pass through the gate electrode material and the first gate insulating film when introducing the impurity to the first site; and
processing the gate electrode material into the gate electrodes.

3. The method according to claim 1, wherein the first conductivity type is a p-type.

4. The method according to claim 1, wherein the first conductivity type is an n-type.

5. A method of manufacturing a semiconductor device comprising:
forming a gate insulating film in an active region of a semiconductor substrate;
introducing an impurity of a first conductivity type into a site where a body region is to be formed in the active region;
forming a gate electrode on the gate insulating film; and
introducing an impurity of the first conductivity type into the site to form the body region, and
wherein the impurity is introduced into the site and a channel region of a transistor of a second conductivity type contemporaneously.

6. The method according to claim 5, further comprising:
depositing a gate electrode material on the gate insulating film;
introducing the impurity to pass through the gate electrode material and the gate insulating film; and
processing the gate electrode material into the gate electrode.

7. The method according to claim 5, wherein the first conductivity type is a p-type.

8. The method according to claim 5, wherein the first conductivity type is an n-type.

* * * * *